(12) United States Patent
Fujikawa

(10) Patent No.: US 11,693,460 B2
(45) Date of Patent: *Jul. 4, 2023

(54) WIRING SUBSTRATE AND DISPLAY PANEL

(71) Applicant: SHARP KABUSHIKI KAISHA, Sakai (JP)

(72) Inventor: Yohsuke Fujikawa, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/576,292

(22) Filed: Jan. 14, 2022

(65) Prior Publication Data
US 2022/0137683 A1   May 5, 2022

Related U.S. Application Data

(62) Division of application No. 16/817,505, filed on Mar. 12, 2020, now Pat. No. 11,256,308.

(60) Provisional application No. 62/818,720, filed on Mar. 14, 2019.

(51) Int. Cl.
G06F 1/00 (2006.01)
G06F 1/18 (2006.01)
G02F 1/1362 (2006.01)

(52) U.S. Cl.
CPC ........ *G06F 1/189* (2013.01); *G02F 1/136286* (2013.01)

(58) Field of Classification Search
CPC .......................... G06F 1/189; G02F 1/136286
See application file for complete search history.

(56) References Cited

U.S. PATENT DOCUMENTS

| 2008/0137021 A1* | 6/2008 | Choi | G02F 1/1345 349/150 |
| 2019/0348357 A1* | 11/2019 | Lee | H01L 23/4985 |
| 2019/0391454 A1* | 12/2019 | Koide | G02F 1/1345 |
| 2020/0241346 A1* | 7/2020 | Fujikawa | H01L 27/124 |

* cited by examiner

*Primary Examiner* — Pete T Lee
(74) *Attorney, Agent, or Firm* — ScienBiziP, P.C.

(57) ABSTRACT

A wiring substrate includes an insulating base that has a plate surface; a first circuit that is provided on the plate surface; a first terminal that is provided on the plate surface, and to which a mounting member is attached; a second terminal that is provided on the plate surface; a first wiring that connects the first circuit and the first terminal to each other; and a second wiring that connects the first terminal and the second terminal to each other, is electrically connected to the first wiring in the first terminal, and has a parallel section in which the second wiring is disposed close to and parallel to the first wiring without being electrically connected to the first wiring outside the first terminal.

24 Claims, 14 Drawing Sheets

WIRING SUBSTRATE AND DISPLAY PANEL

CROSS-REFERENCE TO RELATED APPLICATION

The present application is a divisional of U.S. patent application Ser. No. 16/817,505, filed Mar. 12, 2020, which claims priority from Provisional Application 62/818,720, filed Mar. 14, 2019, the content to which is hereby incorporated by reference into this application.

BACKGROUND OF THE INVENTION

1. Field of the Invention

The present disclosure relates to a wiring substrate and a display panel.

2. Description of the Related Art

There is known a display panel that has a configuration in which an electro-optical material such as liquid crystal is sealed between an array substrate which is a wiring substrate provided with a wiring and the like and a counter substrate which is disposed to face the array substrate and is widely used in a portable device, a TV receiver, or the like as a display unit such as a liquid crystal display device. In recent years, a higher definition for these display panels has been demanded. In order to cope with the higher definition, since it is necessary to increase the number of elements or wirings arranged on a substrate and lay out them in high density, a defect such as disconnection or short circuit is easily generated. Therefore, a yield management becomes important. Generally, a lighting inspection in which an inspection signal is simply applied to the display panel is performed at a stage before various mounting members such as a driver and a connection substrate are attached, and those that meet a certain quality standard are considered to be good products. For this lighting inspection, a dedicated terminal (inspection terminal) for temporarily applying an inspection signal and a dedicated wiring (inspection wiring) may be formed on a substrate in advance.

For example, in a display device disclosed in Japanese Unexamined Patent Application Publication No. 2010-243524, an inspection wiring drawn out from a branch point set in the middle of a drive wiring (scanning signal supply wiring, or the like) is connected to an inspection terminal (fourth inspection terminal, or the like). However, with such a configuration, disconnection or the like of the drive wiring in a section from the branch point to a drive terminal (driver IC mounting terminal or the like) cannot be detected.

Further, in the wiring substrate (array substrate) disclosed in Japanese Unexamined Patent Application Publication No. 2015-18144, an inspection element (TFT or the like) is disposed at a position outside the drive terminal (driver mounting terminal or the like) at the end of the drive wiring (lead-out wiring or the like), and an inspection terminal (a common terminal for inspecting lead-out wiring) is provided along a side where no drive terminal or the like is provided. In such a configuration, it is necessary that each mounting member is limited to an array substrate to be attached with so-called Chip On Glass (COG), or it is necessary to dispose an inspection element or the like in a waste substrate area that is on a mother glass before cutting out a single array substrate and that is not a display panel. When the waste substrate area increases, there is a concern that the number of display panels that can be cut out from one mother glass is reduced.

SUMMARY OF THE INVENTION

The present disclosure has been completed in consideration of the above circumstances, and an object thereof is to obtain a wiring substrate capable of detecting a defect such as disconnection over an entire section of a drive wiring while suppressing an area required for arranging an inspection wiring, and to more appropriately perform a yield management of a display panel.

(1) One embodiment of the present disclosure disclosed in the present specification is a wiring substrate including: an insulating base that has a plate surface; a first circuit that is provided on the plate surface; a first terminal that is provided on the plate surface, and to which a mounting member is attached; a second terminal that is provided on the plate surface; a first wiring that connects the first circuit and the first terminal to each other; and a second wiring that connects the first terminal and the second terminal to each other, is electrically connected to the first wiring in the first terminal, and has a parallel section in which the second wiring is disposed close to and parallel to the first wiring without being electrically connected to the first wiring. The first terminal is a drive terminal for driving the first circuit, and the second terminal can be an inspection terminal for detecting a defect of the first wiring.

(2) Further, in addition to the configuration of the above-described (1), the embodiment of the present disclosure is a wiring substrate in which, in the parallel section, the first wiring and the second wiring are formed of a conductive film formed in the same layer on the plate surface.

(3) Further, in addition to the configuration of the above-described (1), the embodiment of the present disclosure is a wiring substrate in which, in the parallel section, the first wiring and the second wiring are formed of conductive films formed in different layers on the plate surface via an insulating film.

(4) Further, in addition to the configuration of the above-described (3), the embodiment of the present disclosure is a wiring substrate in which, in the parallel section, the first wiring and the second wiring are at least partially overlapped with each other when viewed from a normal direction of the plate surface.

(5) Further, in addition to the configuration of any one of the above-described (1) to (4), the present disclosure is a wiring substrate further including: a second circuit that is provided on the plate surface; a third terminal that is provided on the plate surface, and to which a mounting member is attached; a fourth terminal that is provided on the plate surface; a third wiring that connects the second circuit and the third terminal to each other; and a fourth wiring that is branched from a middle of the third wiring, and connects the second circuit and the fourth terminal together with a portion of the third wiring.

(6) Further, another embodiment of the present disclosure is a display panel including the wiring substrate according to any one of the above-described (1) to (5).

According to the present disclosure, it is possible to obtain a wiring substrate capable of detecting a defect such as disconnection over an entire section of a drive wiring while suppressing an area required for arranging an inspection wiring, and to more appropriately perform a yield management of a display panel.

DETAILED DESCRIPTION OF THE INVENTION

Embodiment 1

Embodiment 1 will be described with reference to FIGS. 1 and 2. The wiring substrate 10 exemplified in the present embodiment can be used as an array substrate configuring, for example, a liquid crystal panel (an example of a display panel) of a liquid crystal display device. In the following description, an upper left side of a paper surface in FIG. 1 is defined as a front side (a lower right side of the paper surface is a back side or a rear side), an upper side is defined as an upper side (a lower side is a lower side), an upper left side is defined as a left side (a lower right side is a right side), and for a plurality of the same members, a sign is attached to one member and a sign of the other member may be omitted.

The wiring substrate 10 is provided with an insulating base 11 formed of a glass plate, a transparent resin plate, or the like. As shown in FIG. 1, the insulating base 11 according to Embodiment 1 has a rectangular plate shape with an up-down direction as a longitudinal direction. Various films such as a conductive film and an insulating film are laminated in a predetermined pattern by a known film forming technique, for example, a photolithography method to form various structures on a plate surface 11A on the front side.

Figure 1:
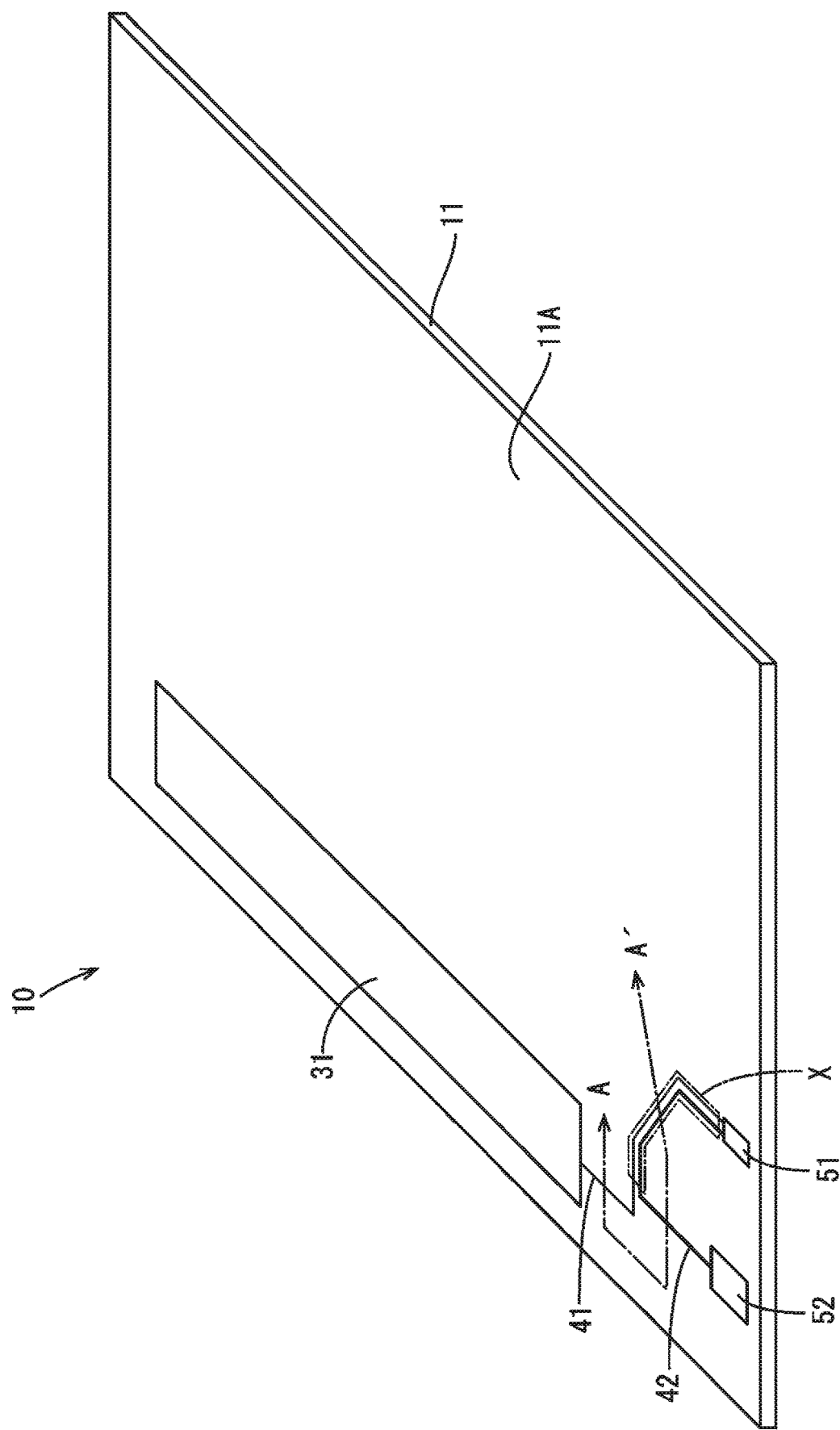
FIG. 1 is a perspective view showing a schematic configuration of a wiring substrate according to Embodiment 1.

More specifically, in the wiring substrate 10 according to the present embodiment, as shown in FIG. 1, a first circuit 31 is provided in an upward rectangular area along a left side on the plate surface 11A, a second terminal 52 is provided in a left lower corner portion, and a first terminal 51 is provided at a position separated from the first circuit 31 and the second terminal 52, and on the right side of the second terminal 52 at the lower edge portion. Further, a first wiring 41 connecting the first circuit 31 and the first terminal 51, and a second wiring 42 connecting the first terminal 51 and the second terminal 52 are formed on the plate surface 11A.

The first circuit 31 can be, for example, a pixel related to the display of an image formed on the plate surface 11A. Here, the pixel may be, for example, a simple matrix driving type pixel formed of a stripe-like transparent electrode or an active matrix driving type pixel provided with a switching element. As the switching element, a thin film diode, a thin film transistor (TFT: Thin Film Transistor) of amorphous silicon, a TFT of polycrystalline silicon, a TFT of oxide semiconductor, or the like can be used. Alternatively, the first circuit 31 can be a row control circuit or a column control circuit formed monolithically on the plate surface 11A for the purpose of driving the above-described pixel, for example. The row control circuit is a circuit formed of a TFT or the like and has a function of setting a pixel array arranged in a matrix to a selected state in a row unit. The column control circuit is a circuit formed of a TFT or the like and has a function of applying a data signal to a pixel array in a column unit. The above-described pixels and circuits are only typical examples of the first circuit 31, and the functions and structures of the first circuit 31 are not particularly limited.

The first circuit 31 can be formed on the plate surface 11A by patterning a conductive film formed of a metal material or a transparent electrode material, an insulating film formed of an organic or inorganic material, a semiconductor film, or the like. As for the metal material configuring the conductive film, a single layer film formed of one kind of metal material selected from copper, titanium, aluminum, molybdenum, tungsten, or the like, a laminated film formed of different kinds of metal materials or an alloy can be used. Further, as the transparent electrode material forming the conductive film, ITO (Indium Tin Oxide), IZO (Indium Zinc Oxide), or the like can be used. An inorganic material such as silicon nitride ($SiN_x$), silicon oxide ($SiO_2$) or an organic material such as an acrylic resin (for example, PMMA) can be used as the insulating film. As the semiconductor film, amorphous silicon, polycrystalline silicon, oxide semiconductor, or the like can be used.

The first terminal 51 has a mounting member such as a driver IC (Integrated Circuit), an FPC (Flexible Printed Circuit), or a COF (Chip On Film) attached thereto, and functions as a drive terminal for driving the first circuit 31. On the other hand, the second terminal 52 is used as an inspection terminal at the time of inspection performed before various mounting members are attached to the wiring substrate 10. The second terminal 52 is a terminal that does not participate in driving, and mounting members such as a driver IC, an FPC, or a COF is not attached to the second terminal 52. In order to avoid a corrosion of a metal portion of the second terminal 52 and a direct entry of static electricity during use, the surface of the second terminal 52 may be covered with an insulating resin to be sealed or may be left as it is, when the display panel or the like is configured after the inspection for the wiring substrate 10 is completed.

The first wiring 41 is a drive wiring for driving the first circuit 31 by transmitting a signal input through the first terminal 51 to the first circuit 31. In order to surely drive the first circuit 31 according to the input signal, it is necessary to sufficiently pay attention to the first wiring 41 so as not to cause short circuit or disconnection with other wiring or the like. On the other hand, the second wiring 42 is a wiring used to determine whether the operation of the first circuit 31 is normal or to inspect whether the first wiring 41 is short-circuited or disconnected by transmitting an inspection signal input through the second terminal 52, at the stage before attaching the mounting member on the plate surface 11A. In other words, the second wiring 42 can be said to be an inspection wiring which is temporarily required when the wiring substrate 10 is inspected.

The first terminal 51 and the second terminal 52, and the first wiring 41 and the second wiring 42 can be formed by patterning a conductive film formed of a metal material or the like laminated on the plate surface 11A. As for the metal material configuring the conductive film, as described above for the first circuit 31, a single layer film formed of one kind of metal material selected from copper, titanium, aluminum, molybdenum, tungsten, or the like, or a laminated film formed of different kinds of metal materials or an alloy can be used.

In the wiring substrate 10 according to the present embodiment, a second wiring 42 functioning as the inspection wiring is not branched from the first wiring 41 as described above, as shown in FIG. 1, has one end connected to the second terminal 52 and the other end connected to the first terminal 51, and directly connects the second terminal 52 and the first terminal 51. Further, the drawing direction of the first wiring 41 drawn out from the first terminal 51 to the first circuit 31 is the same as the drawing direction of the second wiring 42 drawn out from the first terminal 51, and the second wiring 42 is extended toward the first circuit 31 along the first wiring 41 by a predetermined distance. And the second wiring 42 has a path that is bent at an optional position, extends toward an optional position, and reaches the second terminal 52. That is, as shown in FIG. 1, the second wiring 42 has a parallel section X in which the second wiring 42 is disposed close to and parallel to the first wiring 41 by a predetermined distance. The second wiring 42 is disposed so as to be electrically connected to the first wiring 41 at the first terminal 51 and is disposed so as not to be electrically connected to the first wiring 41 outside the first terminal 51.

Figure 2:
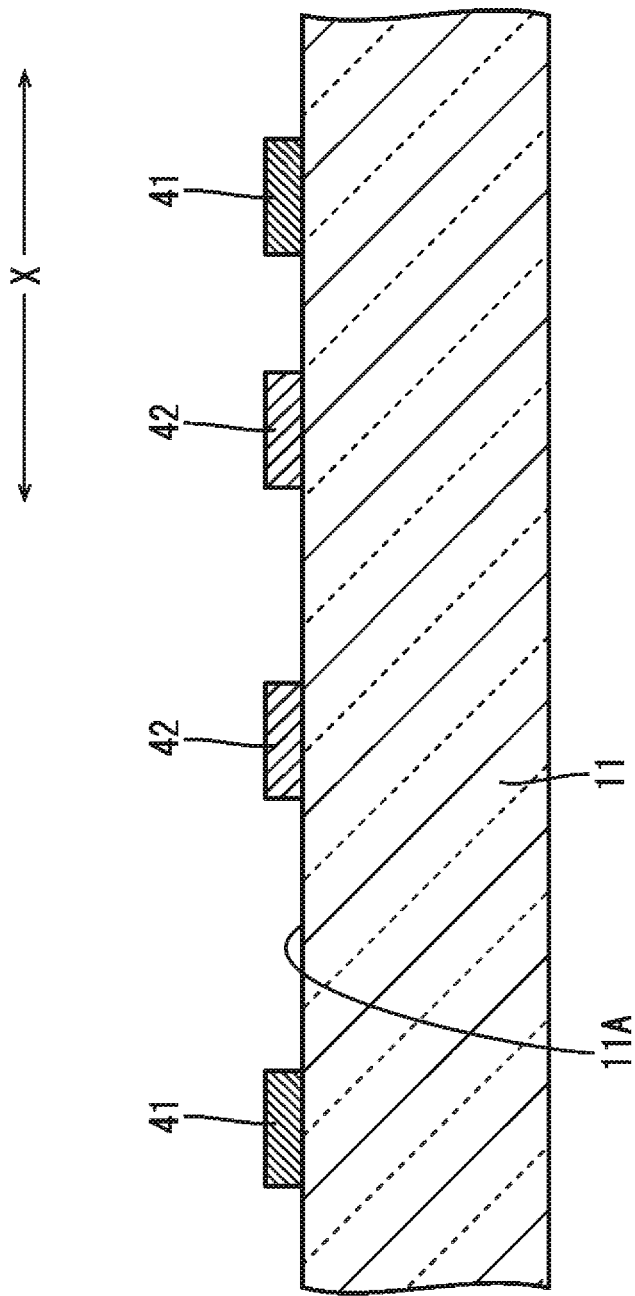
FIG. 2 is a cross-sectional view taken along line A-A' of FIG. 1.

In the wiring substrate 10 according to the present embodiment, as shown in FIG. 2, the first wiring 41 and the second wiring 42 are formed of a conductive film formed in the same layer on the plate surface 11A. Since the both wirings 41 and 42 are formed in the same layer, patterning is performed so as not to cause short circuit between the wirings 41 and 42 particularly in the parallel section X where the wirings 41 and 42 are disposed close to and parallel to each other. In order to prevent short circuit from occurring, an insulating material may be embedded between the both wirings 41 and 42, and the both wirings 41 and 42 may be sealed with a resin or the like.

As described above, the wiring substrate 10 according to the present embodiment includes the insulating base 11 having the plate surface 11A, the first circuit 31 provided on the plate surface 11A, the first terminal 51 provided on the plate surface 11A, and to which the mounting member is attached, the second terminal 52 provided on the plate surface 11A, the first wiring 41 connecting the first circuit 31 and the first terminal 51 to each other, and the second wiring 42 that connects the first terminal 51 and the second terminal 52 to each other, is electrically connected to the first wiring 41 in the first terminal 51, and has the parallel section X in which the second wiring 42 is disposed close to and parallel to the first wiring 41 without being electrically connected to the first wiring 41 outside the first terminal 51.

According to the above configuration, the second terminal 52 and the first circuit 31 are electrically connected through a path of "second terminal 52-second wiring 42-first terminal 51-first wiring 41-first circuit 31". Therefore, when the inspection signal is transmitted using the second terminal 52 as an inspection terminal and the second wiring 42 as an inspection wiring, inspection can be performed over the entire section of the first wiring 41 from the first terminal 51 to the first circuit 31 via the first terminal 51. Here, since when the second wiring 42 for inspection is connected to the first terminal 51, the wiring length of the second wiring 42 becomes longer than that of a configuration in the related art in which a branch point is set in the middle of the first wiring 41, it is necessary to increase the arrangement area of the second wiring 42 by an amount corresponding to the extension, in a normal configuration. However, according to the above configuration, by providing the parallel section X, an increase in the area required for arranging the extended second wiring 42 is suppressed. As a result, the wiring substrate 10 capable of detecting a defect such as short circuit and disconnection over the entire section of the drive wiring (first wiring 41) while suppressing an area required for arranging the inspection wiring (second wiring 42) can be obtained.

Further, according to the above configuration, the second terminal 52 can be relatively freely disposed at a position separated from the first terminal 51. For example, it is not necessary to dispose the second terminal 52 in the mounting area of the mounting member or an area outside the first terminal 51 for driving (a waste substrate area in the mother glass). Therefore, the above configuration can be also applied to a wiring substrate on which each mounting member is attached in a system different from the COG mounting without depending on the mounting system of various mounting members. Further, the configuration can be applied without reducing the number of display panels that can be cut out from one mother glass. Further, for example, the second terminal 52 can be disposed without being restricted by the layout (arrangement pitch or the like) of the first terminal 51. Thus, even in the wiring substrate 10 where the first terminal 51 is arranged at a narrow pitch for high definition, the arrangement pitch of the second terminal 52 can be made sufficiently large so that an expensive probe is not required for the inspection.

In addition, according to the above configuration, the second terminal 52 as the inspection terminal is connected to the first circuit 31 through the second wiring 42 or the first wiring 41. Thus, even when static electricity intrudes from the second terminal 52 during the inspection operation, the second wiring 42 and the first wiring 41 function as protective resistors. For this reason, the first circuit 31 is less likely to be damaged by static electricity.

In the wiring substrate 10 according to the present embodiment, in the parallel section X, the first wiring 41 and the second wiring 42 are formed of a conductive film formed in the same layer on the plate surface 11A. According to such a configuration, the second wiring 42 can be simultaneously formed in a process of forming the first wiring 41 by patterning the conductive film formed in one layer.

Embodiment 2

Figure 3:
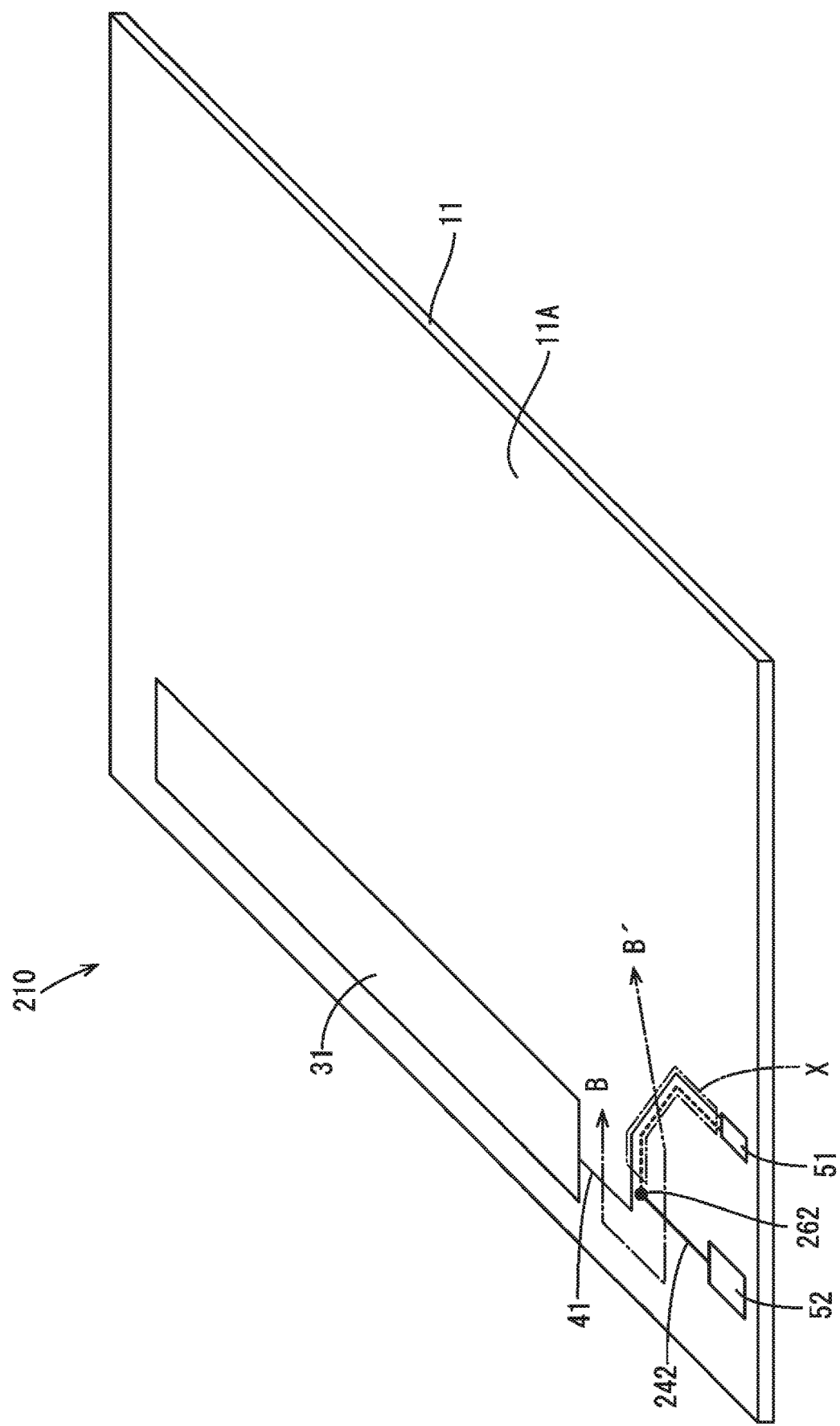
FIG. 3 is a perspective view showing a schematic configuration of a wiring substrate according to Embodiment 2.

Embodiment 2 will be described with reference to FIGS. 3 and 4. As shown in FIG. 3, the wiring substrate 210 according to the present embodiment has a substantially similar basic configuration to the wiring substrate 10 of Embodiment 1, but differs in that the first wiring 41 connecting the first circuit 31 and the first terminal 51 to each other and the second wiring 242 connecting the first terminal 51 and the second terminal 52 to each other are formed of conductive films formed in different layers via the insulating film among various films laminated and formed in a predetermined pattern on the plate surface 11A. Hereinafter, the same configurations as those in Embodiment 1 are denoted by the same reference numerals, and the description thereof will be omitted (the same applies to Embodiment 3 and thereafter).

Figure 4:
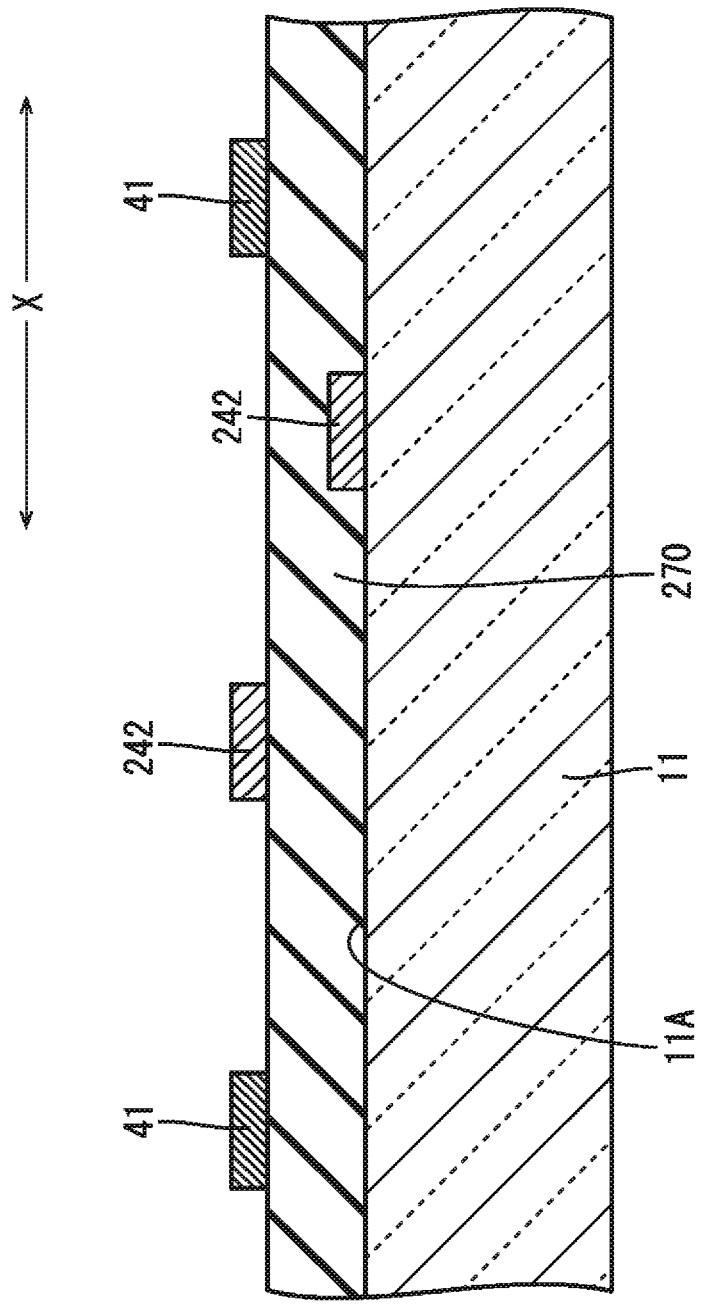
FIG. 4 is a sectional view taken along line B-B' of FIG. 3.

As shown in FIG. 4, in the present embodiment, a lower conductive film patterned directly on the plate surface 11A, an insulating film 270 laminated on the upper layer (front side) of the lower conductive film, and an upper conductive film patterned on the upper layer (front side) of the insulating film 270 are provided on the plate surface 11A of the insulating base 11 configuring the wiring substrate 210. The lower conductive film and the upper conductive film are electrically connected to each other, in a contact hole provided in the insulating film 270 provided between the lower conductive film and the upper conductive film as necessary. All or a part of each of the first terminal 51 and the second terminal 52, and the first wiring 41 and the second wiring 42 are formed of either a lower conductive film or an upper conductive film, and are appropriately electrically connected to each other through a contact hole provided at an optional position.

In the present embodiment, at least in the parallel section X, the first wiring 41 and the second wiring 242 are configured to be formed of conductive films formed in different layers on the plate surface 11A. Specifically, as shown in FIGS. 3 and 4, in the present embodiment, a case where the first terminal 51, the second terminal 52, the entire section of the first wiring 41, and a part of the second wiring 242 are formed of an upper conductive film, and the portion of the second wiring 242 on the first terminal 51 side including the parallel section X is formed of a lower conductive film will be described. As shown in FIG. 3, a contact hole 262 is provided on a wiring path of the second wiring 242, and the upper conductive film and the lower conductive film are electrically connected to each other in the contact hole 262. The second wiring 242 is also electrically connected to the second terminal 52 in a contact hole formed at an appropriate position. As shown in FIG. 4, in the parallel section X where the both wirings 41 and 242 are disposed in parallel, since the insulating film 270 is disposed between the both wirings 41 and 242, short circuit hardly occurs even if they are disposed close to each other. The above-described disposition configuration of the both wirings 41 and 242, and the first terminal 51 and the second terminal 52 is merely one example. In the present embodiment, in the parallel section X, as long as the second wiring 242 and the first wiring 41 are formed of conductive films formed in different layers via the insulating film 270, each structure may be made of any layer.

As described above, in the wiring substrate 210 according to the present embodiment, in the parallel section X, the first wiring 41 and the second wiring 242 are formed of conductive films formed in different layers on the plate surface 11A via the insulating film 270. According to such a configuration, in the parallel section X, since the second wiring 242 is formed in a different layer from the first wiring 41, and the insulating film 270 is disposed therebetween, even if the both wirings 41 and 242 are arranged close to each other, they are not electrically connected to each other. Thus, the second wiring 242 and the first wiring 41 can be arranged in a narrow area when the wiring substrate 210 is viewed in plan. As a result, the area required for arranging the second wiring 242 is further suppressed, and the area of the wiring substrate 210 can be kept small.

Embodiment 3

Figure 5:
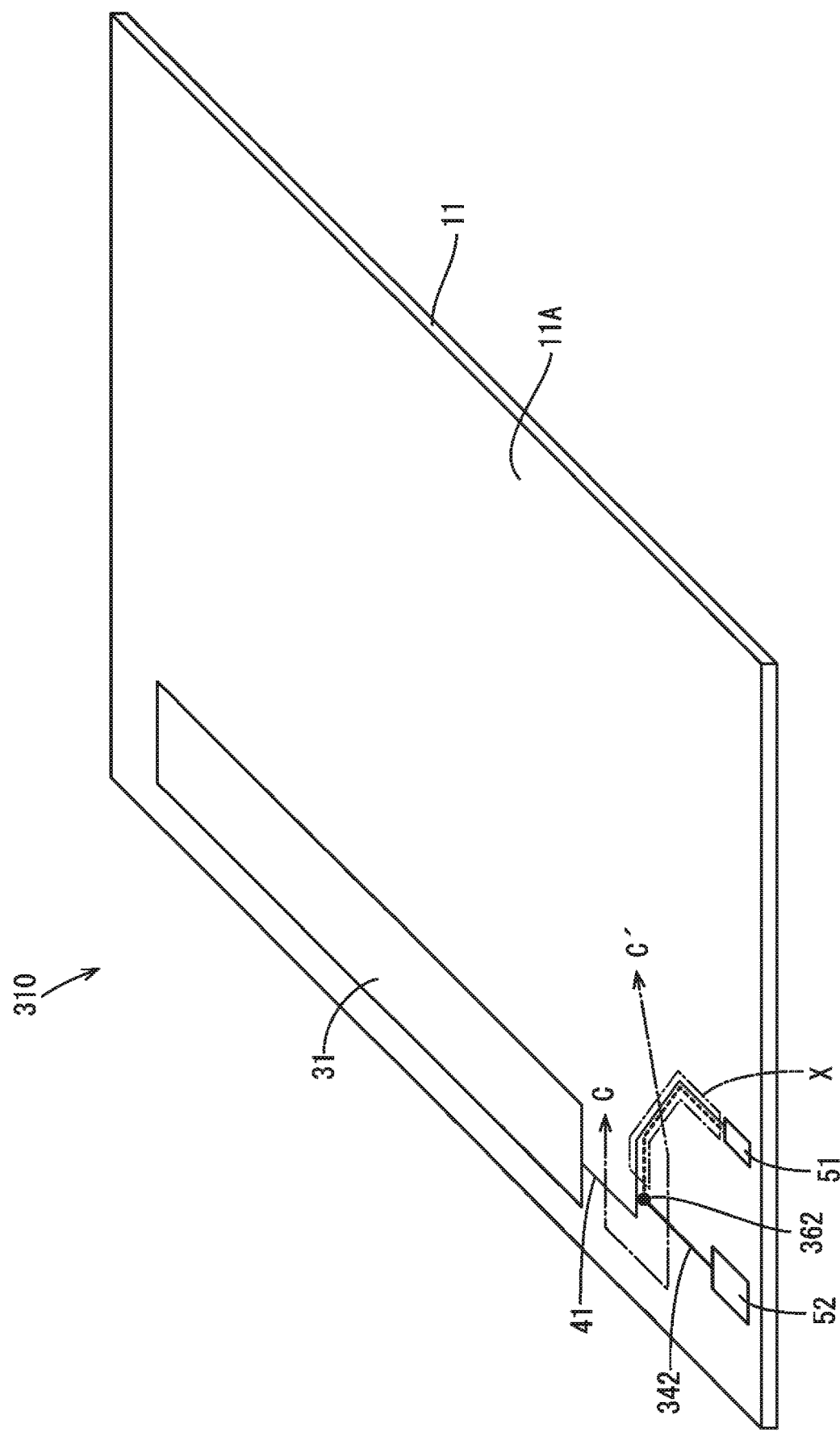
FIG. 5 is a perspective view showing a schematic configuration of a wiring substrate according to Embodiment 3.

Embodiment 3 will be described with reference to FIGS. 5 and 6. As shown in FIG. 5, a wiring substrate 310 according to the present embodiment has a substantially similar basic configuration to the wiring substrate 210 of Embodiment 2, but differs in that the first wiring 41 connecting the first circuit 31 and the first terminal 51 to each other and the second wiring 342 connecting the first terminal 51 and the second terminal 52 to each other are arranged so as to overlap each other in the parallel section X when the wiring substrate 310 is viewed in plan (when viewed from the normal direction of the plate surface 11A).

Figure 6:
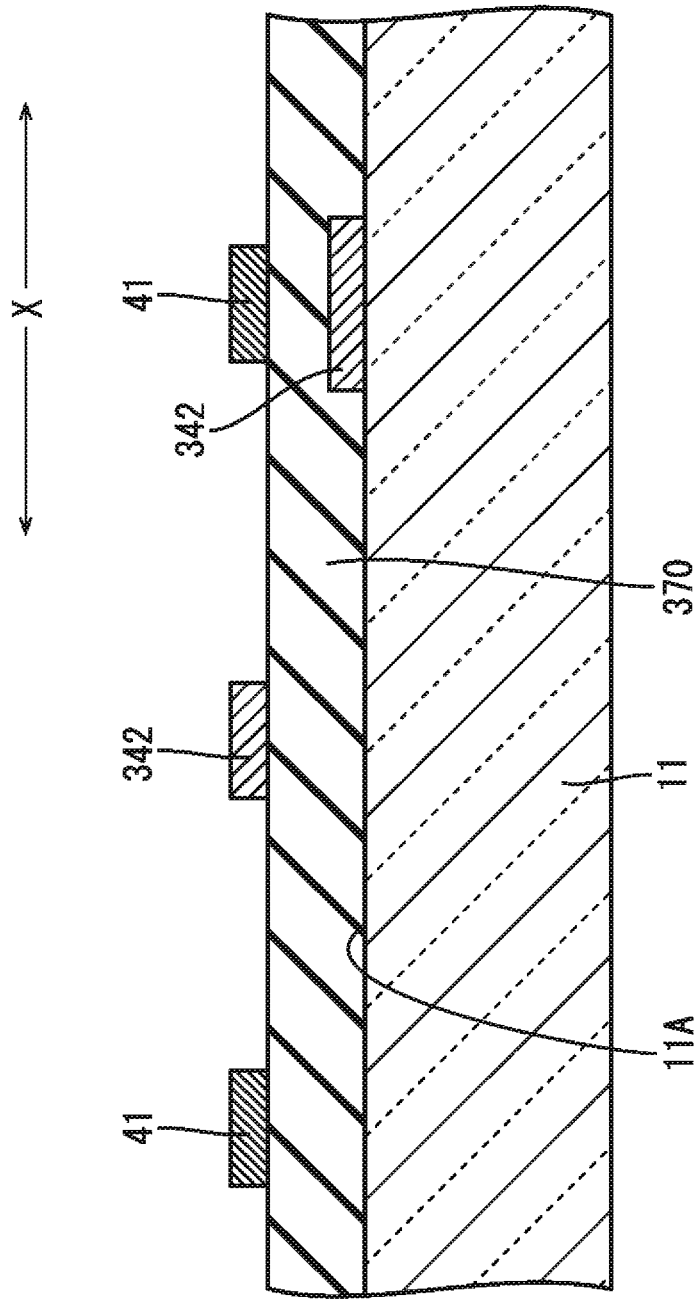
FIG. 6 is a sectional view taken along line C-C' of FIG. 5.

As shown in FIG. 6, in the present embodiment, in the parallel section X, the second wiring 342 made of a lower conductive film is formed so as to overlap with the first wiring 41 formed of an upper conductive film when the wiring substrate 310 is viewed in plan. The second wiring 342 according to the present embodiment has a wiring width larger than that of the first wiring 41 as shown in FIG. 6, and is formed by electrically connecting the upper conductive film and the lower conductive film to each other in a contact hole 362 as shown in FIG. 5. The first wiring 41 and the second wiring 342 may have the same wiring width, and may be formed so that the first wiring 41 has a larger wiring width than the second wiring 342. Further, although FIG. 6 shows the case where center lines of the wiring widths of the both wirings 41 and 342 are arranged in a pyramid shape so as to overlap each other, the center line may be shifted and a part of the wiring widths of the both wirings 41 and 342 may be overlapped with each other. In any case, in the parallel section X, the first wiring 41 and the second wiring 342 are overlapped and disposed in a state where the insulating film 370 is interposed therebetween, the first wiring 41 and the second wiring 342 are not electrically connected to each other in this section.

As described above, in the wiring substrate 310 according to the present embodiment, in the parallel section X, the first wiring 41 and the second wiring 342 are at least partially overlapped with each other when viewed from the normal direction of the plate surface 11A. According to such a configuration, when the wiring substrate 310 is viewed in plan, the apparent wiring width of the structure where the first wiring 41 and the second wiring 342 overlap each other is smaller than the sum of the wiring widths of the first wiring 41 and the second wiring 342. Thus, the both wirings 41 and 342 can be arranged in a very narrow area. As a result, an area required for arranging the both wirings 41 and 342 can be kept extremely small.

Embodiment 4

Figure 7:
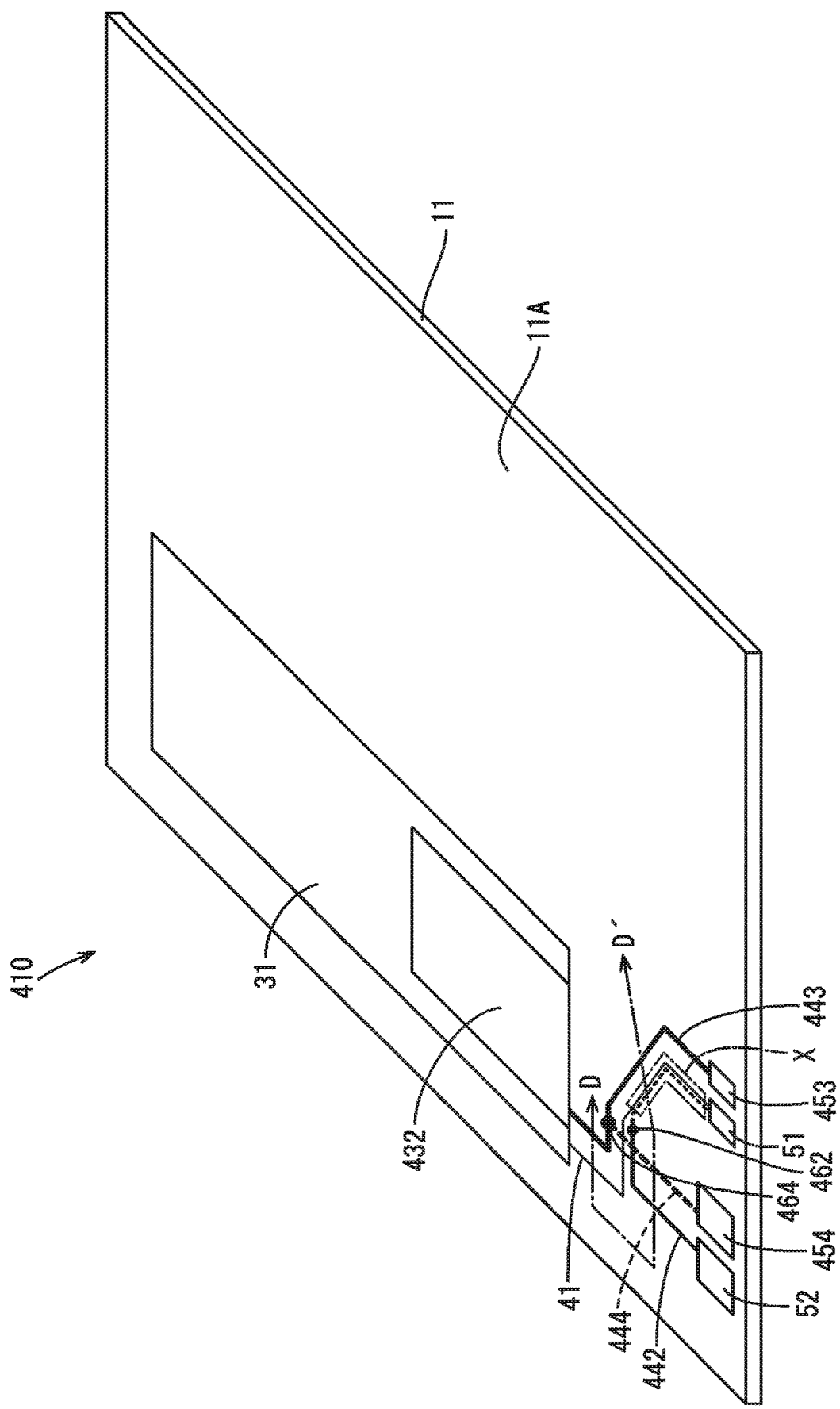
FIG. 7 is a perspective view showing a schematic configuration of a wiring substrate according to Embodiment 4.
Figure 8:
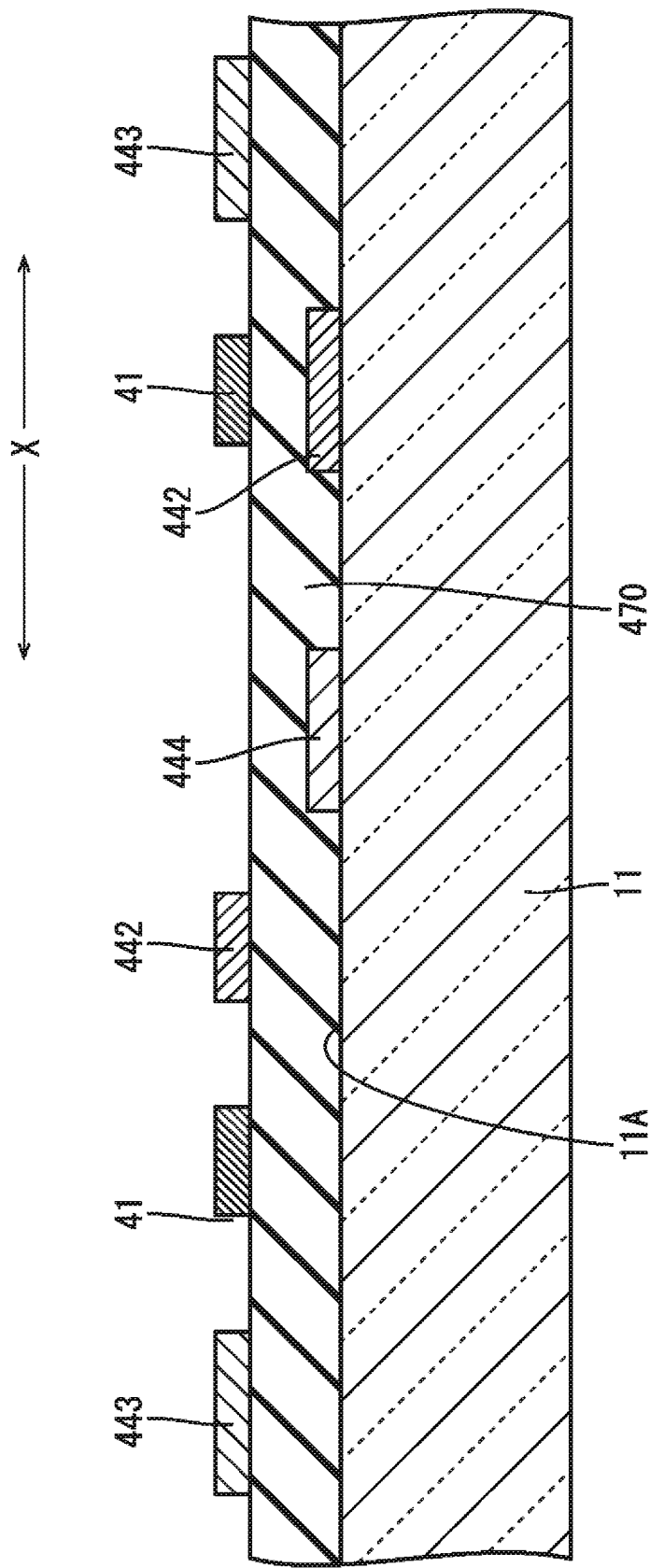
FIG. 8 is a sectional view taken along line D-D' in FIG. 7.

Embodiment 4 will be described with reference to FIGS. 7 and 8. As shown in FIG. 7, a wiring substrate 410 according to the present embodiment is provided with a second circuit 432, a third terminal 453, and a fourth terminal 454 in addition to the basic configuration substantially the same as the wiring substrate 310 of Embodiment 3, and includes a third wiring 443 connecting the second circuit 432 and the third terminal 453 to each other, and a fourth wiring 444 branched from the third wiring 443 and connected to the fourth terminal 454. As shown in FIG. 7, in the wiring substrate 410 according to the present embodiment, the third terminal 453 is provided side by side to the right of the first terminal 51 along the lower edge portion of the plate surface 11A, and a fourth terminal 454 is provided side by side to the right of the second terminal 52. Note that, as shown in FIG. 8, like the second wiring 342 of Embodiment 3, the second wiring 442 is formed of a lower conductive film disposed at a position overlapping the first wiring 41 in the parallel section X, but as shown in FIG. 7, the position where the contact hole 462 is formed is different from the position where the contact hole 362 is formed in Embodiment 3. As described above, a contact hole for electrically connecting the upper conductive film and the lower conductive film to each other can be formed at an optional position in accordance with the layout of each element or wiring.

As shown in FIG. 7, the second circuit 432 according to the present embodiment is a part of the first circuit 31. The second circuit 432 may be a circuit separate from the first circuit 31, but at least a part of the circuit may be included in the first circuit 31. The second circuit 432 may have the same function as that of the first circuit 31, for example, or may be the same as the first circuit 31. The second circuit 432 can be formed of the same material as that of the first circuit 31. In the present embodiment, a circuit to which the first wiring 41 is connected is called the first circuit 31, and the circuit to which the third wiring 443 is connected is called the second circuit 432 in order to distinguish between the first wiring 41 and the third wiring 443 connected thereto.

A mounting member is attached to the third terminal 453 similarly to the first terminal 51. The third terminal 453 functions as a drive terminal for driving the second circuit 432. The third terminal 453 according to the present embodiment is formed of, for example, an upper conductive film. On the other hand, the fourth terminal 454 is used as an inspection terminal similarly to the second terminal 52. That is, it is used in inspection performed before various kinds of mounting members are attached on the wiring substrate 410, and the mounting members are not attached on the second terminal 52. In order to avoid a corrosion of a metal portion of the fourth terminal 454 and a direct entry of static electricity during use, as in the case of the second terminal 52, the surface of the fourth terminal 454 may be covered with an insulating resin to be sealed or may be left as it is, when the display panel or the like is configured after the inspection for the wiring substrate 410 is completed. The fourth terminal 454 according to the present embodiment can also be formed of, for example, an upper conductive film, but is not limited thereto.

The third wiring 443 is a drive wiring for transmitting a signal input through the third terminal 453 to the second circuit 432 and driving the signal. The fourth wiring 444 is an inspection wiring temporarily used to determine whether the operation of the second circuit 432 is normal or to inspect whether the third wiring 443 is short-circuited or disconnected by transmitting the inspection signal input through the fourth terminal 454.

Here, the first wiring 41 and the third wiring 443 according to the present embodiment are used as a wiring for transmitting a signal having no trouble in operation even if the load is large. Examples of this kind of signal include a monolithic gate driver initialization signal or a start pulse signal, or an input signal such as scan direction switching signal. In addition, an output signal from the gate driver for monitoring the operation of the gate driver instead of the input signal is also given as an example. On the other hand, the third wiring 443 and the fourth wiring 444 are wirings for transmitting signals based on a low-resistance wiring with low delay. Examples of this kind of signal include, for example, a clock signal and a power supply of a gate driver formed monolithically. Further, a power supply line connected to the storage capacitor line typically provided in the pixel array of the active matrix type and a common power supply line connected to the counter electrode are also given as an example.

In consideration of the above signal properties, the first wiring 41 and the second wiring 42 are formed of relatively thin wiring. From the viewpoint of driving, these wirings have no problem even if the resistance is relatively high, but are liable to cause disconnection or short circuit, and since such a defect may cause a malfunction of the display panel or the like, it is preferable to detect a wiring defect with as high accuracy as possible in the inspection process, and not to send it to a subsequent process. On the other hand, the resistance of the third wiring 443 and the fourth wiring 444 is required to be reduced from a viewpoint of driving, the third wiring 443 and the fourth wiring 444 are formed so as to have larger cross-sectional areas than those of the first wiring 41 and the second wiring 42. Specifically, patterning can be performed so as to increase the wiring width, or the wiring can be formed so that the thickness of the wiring becomes large by overlapping the conductive films. Since such wiring has a large cross-sectional area, disconnection or the like is relatively unlikely to occur. In the present embodiment, as shown in FIG. 8 and the like, a case where the third wiring 443 is formed so as to have a relatively large wiring width in the upper conductive film over the entire section and the fourth wiring 444 is formed so as to have a relatively large wiring width in the lower conductive film will be described.

In the present embodiment, as shown in FIG. 7, a connection relationship between the third wiring 443 and the fourth wiring 444 and a connection relationship between the first wiring 41 and the second wiring 442 are made different from each other. As described in detail in Embodiment 1, in order to detect a defect such as disconnection over the entire section of the first wiring serving as the drive wiring, the present disclosure has a configuration in which a parallel section X is provided in order to connect the second wiring serving as the inspection wiring to the drive terminal instead of branching from the middle of the first wiring, and to minimize the area required for arranging the second wiring. However, it is not necessary to form all the wirings related to the driving of the circuit in accordance with the connection relationship between the first wiring and the second wiring. That is, such a configuration is not required to be applied to the drive wiring having a low possibility of disconnection or the like. Since the third wiring 443 according to the present embodiment is formed so as to have a large cross-sectional area due to driving requirements, the possibility of disconnection or the like is low as described above. Although connection configuration having a parallel section X can be applied to these wirings, there is a problem that the wiring substrate 410 is made unnecessarily large thereby it is difficult to reduce the size of the product and to suppress the manufacturing cost. Therefore, in the present embodiment, the fourth wiring 444 is not connected to the third terminal 453 according to the connection configuration of the second wiring 442, but branched from an optional position of the third wiring 443 and connected to the fourth terminal 454. Specifically, as shown in FIG. 7, a contact hole 464 is provided in the insulating film 470 at a position where the distance to the fourth terminal 454 becomes minimum on the path of the third wiring 443, thereby the third wiring 443 formed of the upper conductive film is connected to the fourth wiring 444 formed of the lower conductive film. In this way, the wiring length of the fourth wiring 444 can be made shortest, which is preferable.

As described above, the wiring substrate 410 according to the present embodiment includes: a second circuit 432 provided on the plate surface 11A; a third terminal 453 provided on the plate surface 11A, and to which a mounting member is attached; a fourth terminal 454 provided on the plate surface 11A; a third wiring 443 connecting the second circuit 432 and the third terminal 453 to each other; and a fourth wiring 444 that is branched from the middle of the third wiring 443 and connects the second circuit 432 and the fourth terminal 454 together with a part of the third wiring 443, and the third wiring 443 is formed so as to have a larger cross-sectional area than the first wiring 41 at least in a section from a branch point with the fourth wiring 444 to the third terminal 453.

In general, the wiring substrate is provided with a plurality of drive wirings for transmitting various signals, and the size of the cross-sectional area (a wiring width and a wiring thickness) required for each drive wiring varies depending on the characteristics of the signals. According to the configuration of the present embodiment, the second wiring 442 for inspection for inspecting the first wiring 41 for driving that is relatively thin is drawn out from the first terminal 51 and has the parallel section X in which the second wiring 442 is disposed close to and parallel to the first wiring 41. On the other hand, the fourth wiring 444 for inspection for inspecting the third wiring 443 for driving that is relatively thick is branched from an optional position (contact hole 464) of the third wiring 443. Thereby, for the third wiring 443 in which disconnection or the like is unlikely to occur, the wiring length of the fourth wiring 444 can be reduced by drawing out the fourth wiring 444 from the middle of the third wiring 443, while the first wiring 41 in which disconnection or the like is likely to occur can be inspected over the entire section. As described above, in the present embodiment, the connection relationship with the inspection wiring related to the inspection is different depending on the type (in other words, the wiring width or the wiring thickness) of the drive wiring formed according to the property of the signal to be transmitted. As a result, the unnecessary enlargement of the wiring substrate 410 can be avoided by minimizing the area required for arranging the inspection wiring while increasing the defect detection rate. In this case, the second circuit 432 and the third terminal 453 may be connected not only by one wiring (wiring equivalent to the third wiring 443) but also by another wiring having a path different from this wiring. In such a configuration, since a plurality of paths connecting the second circuit 432 and the third terminal 453 are secured, it is considered that the possibility of occurrence of a defect due to the connection failure is small. Thus, it is possible to inspect one wiring arranged close to the first wiring 41 of the plurality of wirings connecting the second circuit 432 and the third terminal 453 while maintaining a certain inspection accuracy, even if the one of the wirings is maintained at the same wiring width as the first wiring 41.

Embodiment 5

Embodiment 5 will be described with reference to FIGS. 9 to 12. In the present embodiment, a liquid crystal panel (an example of a display panel) 5 provided with an array substrate (an example of a wiring substrate) 510 is illustrated. The liquid crystal panel 5 is a so-called liquid crystal cell, and includes an array substrate (sometimes referred to as an active matrix substrate, an element-side substrate, a device substrate, or the like) 510, and a counter substrate (sometimes referred to as a color filter substrate, a common electrode substrate, or the like) 520 disposed to face thereto bonded together with a predetermined gap therebetween. Both substrates 510 and 520 are bonded by a sealing material such as an epoxy resin and the like, and a liquid crystal material is filled in a space formed between the both substrates 510 and 520. Polarizing plates are arranged outside the liquid crystal panel 5, that is, on the front side of the counter substrate 520 and on the rear side of the array substrate 510, respectively.

Figure 9:
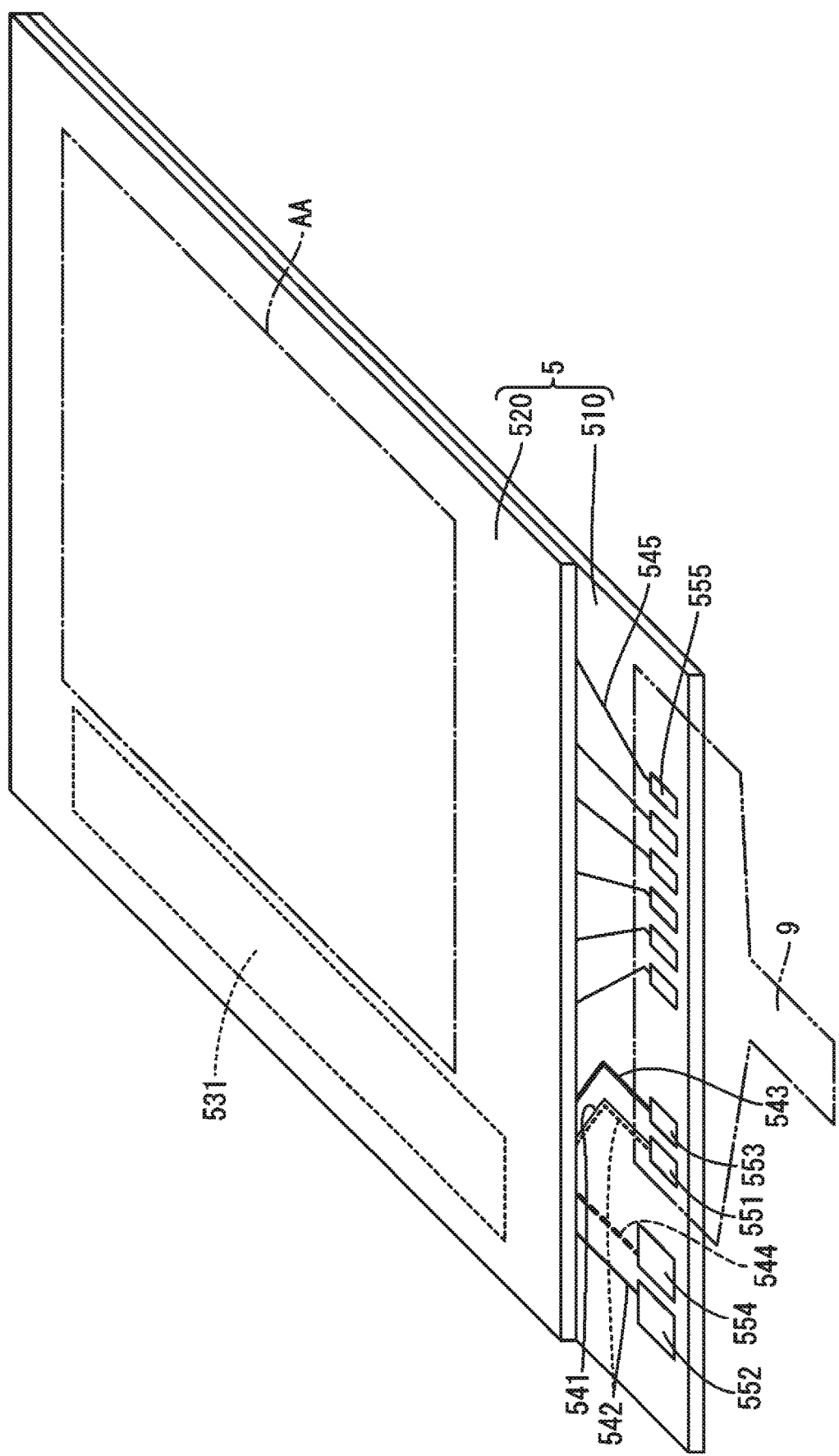
FIG. 9 is a perspective view showing a schematic configuration of a display panel according to Embodiment 5.

As shown in FIG. 9, the array substrate 510 is formed so that the dimension in the left-right direction is approximately equal to that of the counter substrate 520, while the dimension in the up-down direction is increased. The counter substrate 520 is overlapped on the front side of the array substrate 510 in a state where the upper end edge and the right and left end edges are aligned. Therefore, a substrate non-overlapping area not covered by the counter substrate 520 is formed at a lower end portion of the array substrate 510, and a terminal or the like described later is provided in the substrate non-overlapping area. Hereinafter, an area below a pixel array area AA in the array substrate 510 may be referred to as a terminal forming area TA (refer to FIG. 10, the terminal forming area TA includes a substrate non-overlapping area).

Further, as shown in FIG. 9, the pixel array area AA is formed in an area where the both substrates 510 and 520 are overlapped at the center of the liquid crystal panel 5, and an image is displayed in the pixel array area AA. A drive circuit for driving each pixel PX formed in the pixel array area AA, various terminals, and various wirings connecting them are provided in an area outside the pixel array area AA.

The counter substrate 520 is provided with an insulating base formed of a glass plate or a transparent resin plate. A counter electrode CE (refer to FIG. 10), for example, is provided on the rear side (an array substrate 510 side and a liquid crystal material side) of the insulating base to form a light shielding film or an alignment film. The pixel array area AA is divided into three sub pixels per pixel which can be driven independently, and by disposing red, green, and blue color filters for each of the three sub pixels, it is possible to cope with the color display. In some cases, a counter electrode CE is not formed on the counter substrate, but in this case, a common electrode is formed on the array substrate.

The array substrate 510 is provided with the insulating base 11 (refer to FIGS. 11 and 12) formed of a glass plate, a transparent resin plate, or the like. On the plate surface 11A on the front side of the insulating base (the counter substrate 520 side, the liquid crystal material side), for example, a first metal film (an example of a gate metal film, a lower conductive film), a gate insulating film 570, a semiconductor film, a second metal film (an example of a source metal film and an upper conductive film), an organic insulating film, a transparent electrode film, and an alignment film are laminated in a predetermined pattern in order from the lower layer side (the insulating base side and the rear side). The first metal film and the second metal film can be formed of a single layer film formed of one kind of metal material selected from, for example, copper, titanium, aluminum, molybdenum, tungsten, or the like, or a laminated film formed of different kinds of metal materials or an alloy can be used. The gate insulating film (an example of an insulating film) 570 is formed of, for example, silicon nitride (SiNx) or silicon oxide ($SiO_2$). The semiconductor film is formed of, for example, a silicon thin film formed of amorphous silicon, low-temperature polycrystalline silicon, and the like, and an oxide thin film containing indium (In), gallium (Ga), zinc (Zn), and the like which are a kind of oxide semiconductor. The films formed on the array substrate 510 are not limited to these, and other films may be appropriately laminated and disposed in addition to or in place of the above films. Alternatively, some of the above films may be omitted.

Figure 10:
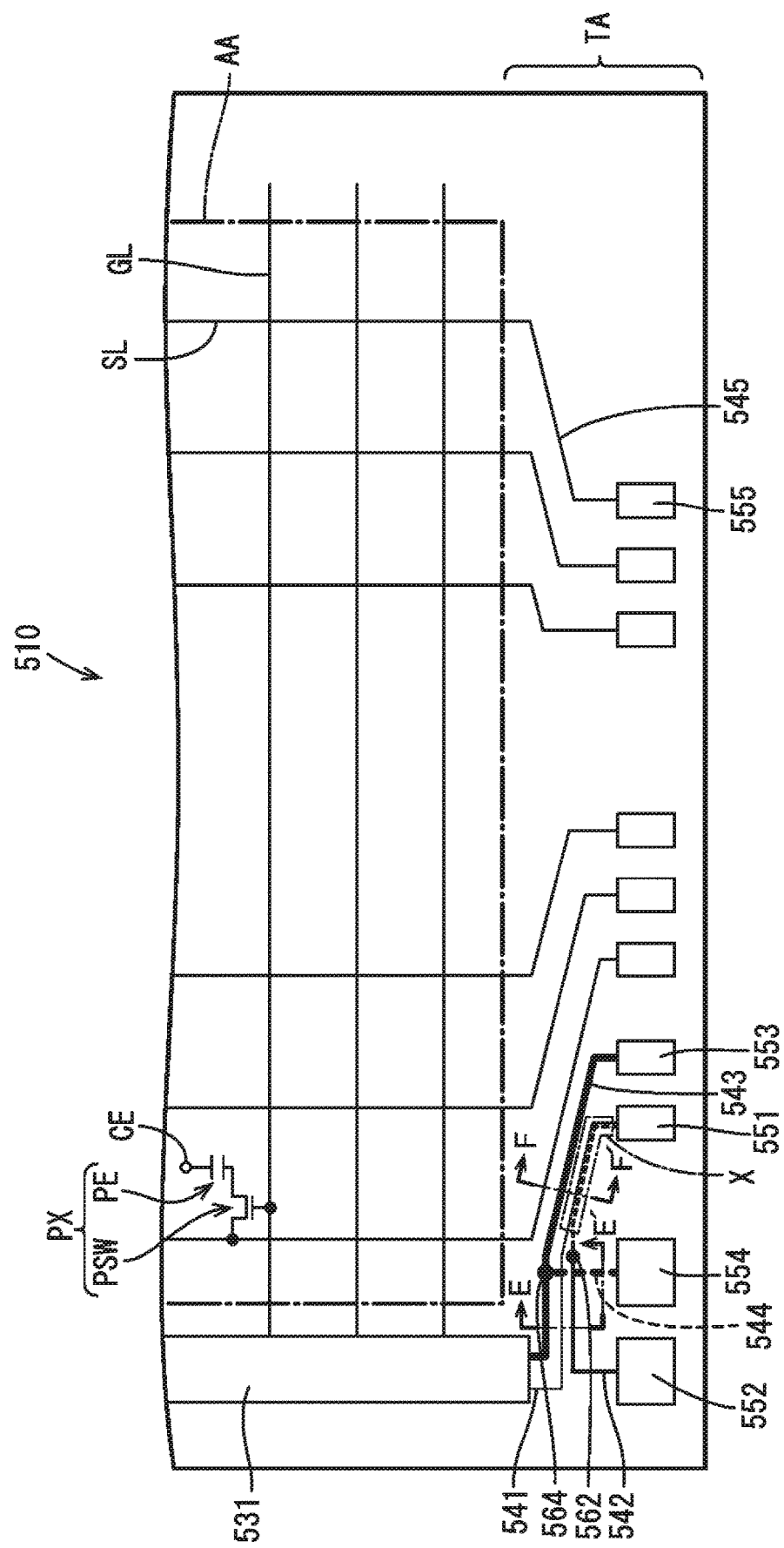
FIG. 10 is a plan view schematically showing a layout of wirings and the like arranged in a terminal forming area TA of an array substrate configuring a display panel.

As shown in FIG. 10, in the pixel array area AA on the front surface of the array substrate 510, a plurality of gate bus lines GL and a plurality of source bus lines SL are formed in a matrix (matrix) in the left-right direction and the up-down direction by the above-described film, and an in-pixel switching element PSW formed of, for example, a TFT and a pixel electrode PE are provided near each of these intersections, thereby forming a pixel PX. For example, the gate bus line GL can be formed of a first metal film, and the source bus line SL can be formed of a second metal film. The pixel electrode PE is formed of, for example, a transparent electrode film and is disposed to face the counter electrode CE provided on the counter substrate 520.

As shown in FIGS. 9 and 10, a gate driver drive circuit (an example of a first circuit) 531 for driving a gate driver is provided in a rectangular area along the left side outside the pixel array area AA on the front surface of the array substrate 510. The gate driver has a function of sequentially applying scanning signals to a plurality of gate bus lines GL arranged in the pixel array area AA and sequentially setting the in-pixel switching element PSW to a selected state in a row unit. The gate driver drive circuit 531 is formed monolithically on the array substrate 510 with the semiconductor film, the first metal film, the second metal film, or the like as a base similarly to the TFT disposed in the pixel PX. In the manufacturing process of the liquid crystal panel 5 (array substrate 510), at the same time as forming each structure formed in the pixel array area AA, the metal film, various insulating films, and the semiconductor film can be patterned by a known photolithography method. In the present embodiment, the source bus line SL is directly driven from an external circuit.

As shown in FIGS. 9 and 10, in the terminal forming area TA on the lower side, outside the pixel array area AA on the front surface of the array substrate 510, along the lower side in order from the left corner portion, a second terminal 552 for inspecting the gate driver drive path, the fourth terminal 554 for inspection as well, a first terminal 551 for driving the gate driver, a third terminal 553 for driving as well, and a plurality of fifth terminals 555 for driving the pixel PX via the source bus line SL are provided side by side. As shown in FIG. 9, an FPC (an example of a mounting member) 9 is attached to a drive terminal among the above, that is, the first terminal 551, the third terminal 553, and the plurality of fifth terminals 555. It is preferable that the drive terminals 551, 553, and 555 are disposed such that one FPC 9 can be electrically attached. In addition, terminals other than the above terminals, such as terminals for common electrodes and storage capacitor lines, may be provided in the terminal forming area TA. For example, the array substrate 510 is provided with a terminal, a wiring, or the like for energizing the source bus line SL described in Embodiment 6 described later, but these illustrations are omitted in FIGS. 9 and 10.

The fifth terminal 555 is a terminal for driving the pixel PX by energizing the source bus line SL from an external circuit, and as shown in FIG. 10 and the like, a plurality of fifth terminals 555, for example, the same number as the plurality of source bus lines SL arranged in the pixel array area AA, are disposed side by side at the center along the lower side of the array substrate 510. Normally, the fifth terminals 555 are arranged at a pitch smaller than the arrangement pitch of the source bus lines SL on the pixel array area AA side. The fifth terminal 555 can be formed of, for example, an upper conductive film or a lower conductive film. When the fifth terminal 555 is formed of the same conductive film as the fifth wiring 545 described later, it is electrically connected as it is, and when the fifth terminal 555 is formed of a different conductive film, it is electrically connected to the fifth wiring 545 through a contact hole provided in the gate insulating film 570.

Figure 12:
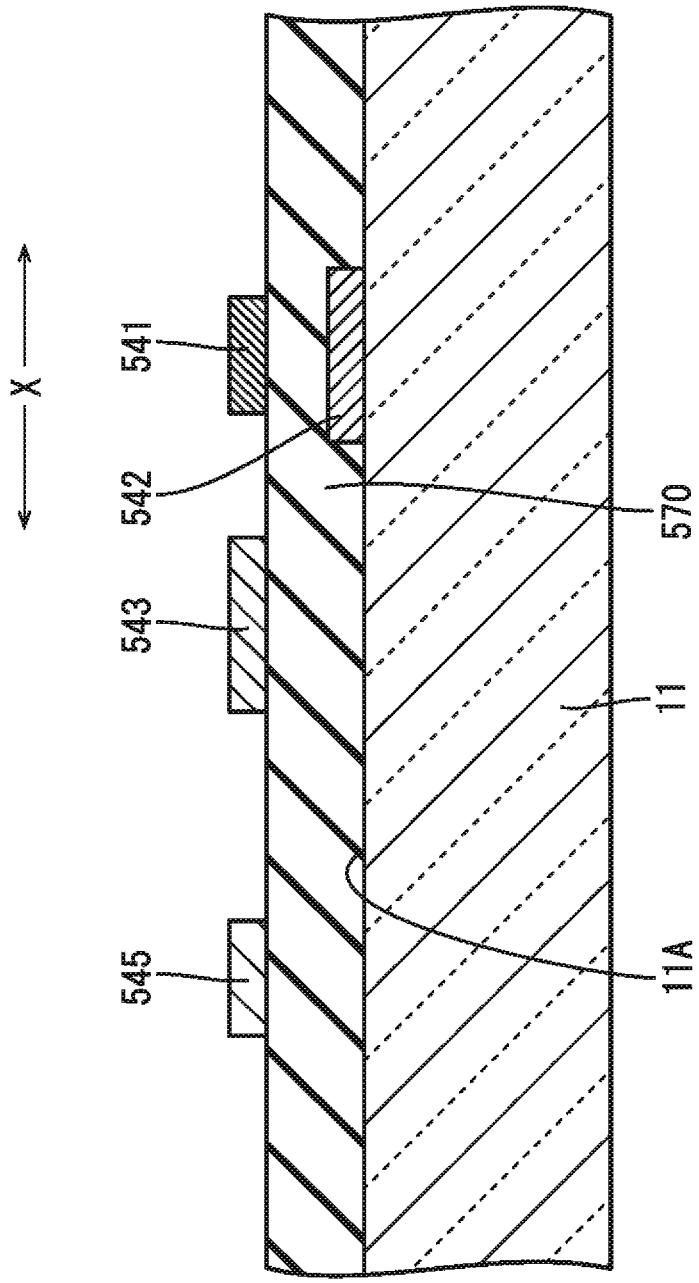
FIG. 12 is a sectional view taken along line F-F' of FIG. 10.

As shown in FIG. 10 and the like, the fifth wiring 545 is drawn out from the fifth terminal 555 and extended so as to spread toward the pixel array area AA and connected to a corresponding source bus line SL. In other words, the fifth wiring 545 is provided so as to be narrowed down in a fan shape from the source bus line SL of the pixel array area AA to the fifth terminal 555. A data signal input from the FPC 9 to the fifth terminal 555 is transmitted to each pixel PX via the fifth wiring 545 and the source bus line SL. The source bus line SL is often configured of the wiring of a conductive film having a small sheet resistance, and the wiring width is, for example, about several μm. The wiring width of the fifth wiring 545 drawn out from the source bus line SL is made relatively small as shown in FIG. 12. In the present embodiment, almost all sections of the fifth wiring 545 are formed of the upper conductive film.

Figure 11:
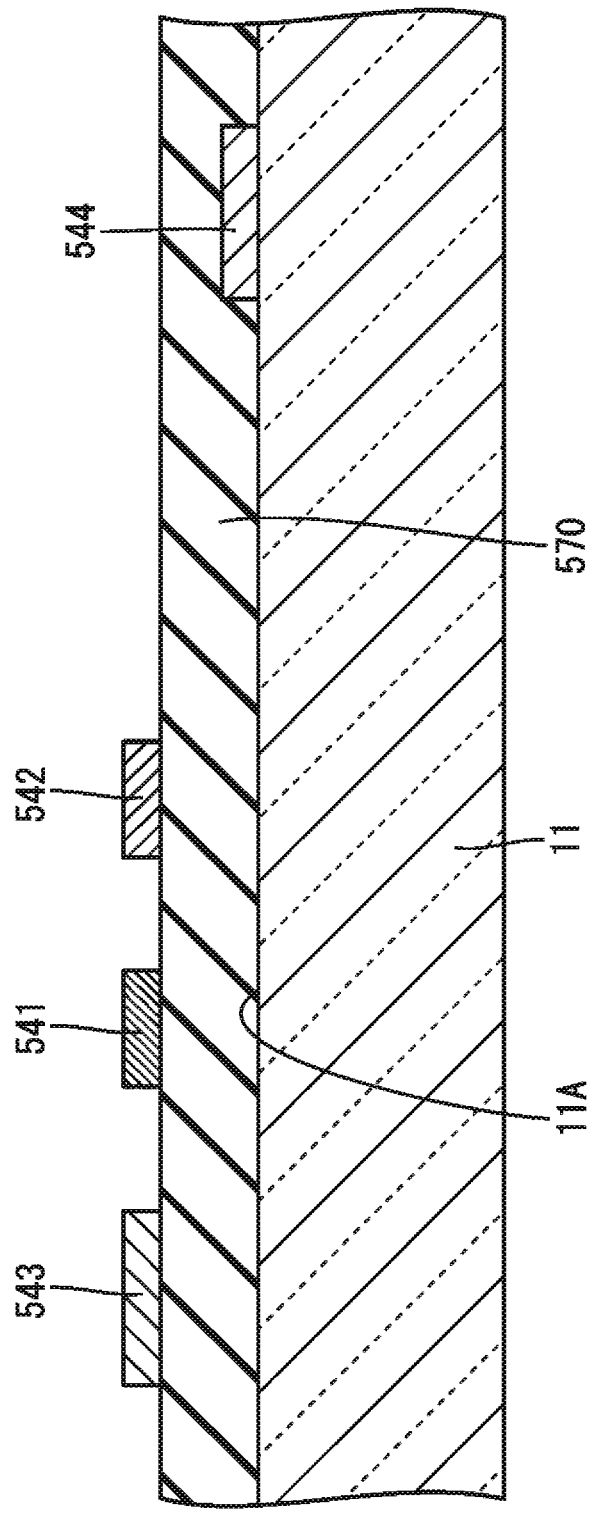
FIG. 11 is a sectional view taken along line E-E' of FIG. 10.

The first terminal 551, the second terminal 552, the third terminal 553, and the fourth terminal 554 correspond to the first terminal 51, the second terminal 52, the third terminal 453, and the fourth terminal 454 according to Embodiment 4, and can be similarly configured using the same material as these. A first wiring 541 for driving connecting the gate driver drive circuit 531 and the first terminal 551, a second wiring 542 for inspection connecting the first terminal 551 and the second terminal 552, and the third wiring 543 for driving connecting the gate driver drive circuit 531 and the third terminal 553, the fourth wiring 544 for inspection connecting the third terminal 553 and the fourth terminal 554 correspond to the first wiring 41, the second wiring 442, the third wiring 443, and the fourth wiring 444 according to Embodiment 4, and can be similarly configured using the same material as these. Specifically, as shown in FIGS. 11 and 12, almost all sections of the first wiring 541 as a drive wiring and the third wiring 543 according to the present embodiment are formed of, for example, a second metal film corresponding to an upper conductive film. Further, the fourth wiring 544 as an inspection wiring, for example, is formed of a first metal film corresponding to a lower conductive film, and electrically connected to the third wiring 543 in a contact hole 564 provided at a position where the distance between the third wiring 543 and the fourth terminal 554 is shortest. Further, in the second wiring 542 which is also a wiring for inspection can be configured such that, for example, a section on the second terminal 552 side is formed of a second conductive film, and a section on the first terminal 551 side including the parallel section X is formed of a first conductive film, and the second wiring 542 is electrically connected in the contact hole 562. As shown in FIG. 12, the second wiring 542 can be disposed so as to overlap the first wiring 541 in the parallel section X when the array substrate 510 is viewed in plan.

A plurality of kinds of signals are required for driving the gate driver. Such signals include a clock signal, an initialization signal, a start pulse signal, a scan direction switching signal, and a power supply. Among them, the clock signal and the power supply preferably suppress a large delay and a voltage drop, and are preferably transmitted by a wiring with a wiring width of several μm to several tens μm if the conductive film has a small sheet resistance, and transmitted by a wiring with a wiring width of approximately 10 μm to several hundreds μm if the conductive film has a large sheet resistance. Thus, in the present embodiment, the third terminal 553 and the third wiring 543 are used as a terminal and a wiring for transmitting them. As for the other signals, since the delay is less likely to be a problem, it is preferable that the wiring is made thin with a wiring width of about several μm to 10 μm in order to reduce the area required for these wirings. Thus, the first terminal 551 and the first wiring 541 according to the present embodiment are used as a terminal and a wiring for transmitting them. Therefore, as shown in FIG. 11 and the like, the third wiring 543 and the fourth wiring 544 for inspecting the third wiring 543 are formed so as to have a larger wiring width than the first wiring 541 and the second wiring 542 for inspecting the first wiring 541.

As described above, in the present embodiment, in the configuration in which the first terminal 551 and the third terminal 553 to which different signals are applied are intensively disposed in the terminal forming area TA formed on the lower edge portion of the array substrate 510, the connection between the second terminal 552 for inspection and the fourth terminal 554, and the second wiring 542 for inspection and the fourth wiring 544 are not uniform, and the configuration of the inspection terminal and the inspection wiring is changed according to the type of signal. Typically, for the third wiring 543 and the fourth wiring 544 formed so as to have a large cross-sectional area, the fourth wiring 544 for inspection is branched from the branch point (contact hole 564) provided at an optional position on the path of the third wiring 543 for driving to form a wiring path to the fourth terminal 554 for inspection. Further, for the first wiring 541 and a second wiring 542 having a relatively small cross-sectional area, a wiring path in which the second wiring 542 for inspection is drawn out from the first terminal 551 for driving, and a wiring path having a parallel section X in which the second wiring 542 is arranged in parallel along the first wiring 541 for driving and extending to the second terminal 552 for inspection is formed. Thus, the first wiring 541 having a relatively small cross-sectional area and easy to cause disconnection or the like can be inspected over the entire section. Thus, the second wiring 542 has a parallel section X, and the fourth wiring 544 is formed so as to branch from the third wiring 543, thereby suppressing areas required for arranging the wirings 542 and 544 for inspection. As a result, the area of the array substrate 510 including the terminal forming area TA can be maintained as small as possible even when many terminals are intensively disposed in the terminal forming area TA of the array substrate 510, and the waste substrate area in the mother glass can be eliminated.

As described above, the liquid crystal panel (display panel) 5 according to the present embodiment is provided with an array substrate (an example of a wiring substrate) 510 having a wiring configuration similar to, for example, Embodiment 1, Embodiment 3, and Embodiment 4. According to such a configuration, it is possible to detect a defect such as disconnection over an entire section of the first wiring 541 for driving and relatively thin, while suppressing the area required for arranging the inspection wiring (second wiring 542 and fourth wiring 544) on the array substrate 510, and to more appropriately perform the yield management of the liquid crystal panel 5.

Embodiment 6

Embodiment 6 will be described with reference to FIG. 13. In the present embodiment, a wiring configuration capable of detecting a defect of a fifth wiring 545, a source bus line SL, or the like formed on the array substrate 510 according to Embodiment 5 will be described. In the above-described Embodiment 5, a method of energizing the gate bus line GL when performing lighting inspection on the liquid crystal panel 5 has been explained by using the first terminal 551 and the first wiring 541, the second terminal 552 and the second wiring 542, the third terminal 553 and the third wiring 543, and fourth terminal 554 and the fourth wiring 544. Actually, in order to turn on the liquid crystal panel 5 during the inspection, it is necessary to energize not only the gate bus line GL of the pixel array area AA but also the source bus line SL. In general, however, terminals for energizing the source bus line SL are arranged at narrow pitches on the array substrate, and precise and expensive probes are required for energizing through the terminals. Therefore, a configuration for energizing the source bus line SL without using the fifth terminal 555 is provided on the array substrate 510 according to Embodiment 5. These will be explained below.

Figure 13:
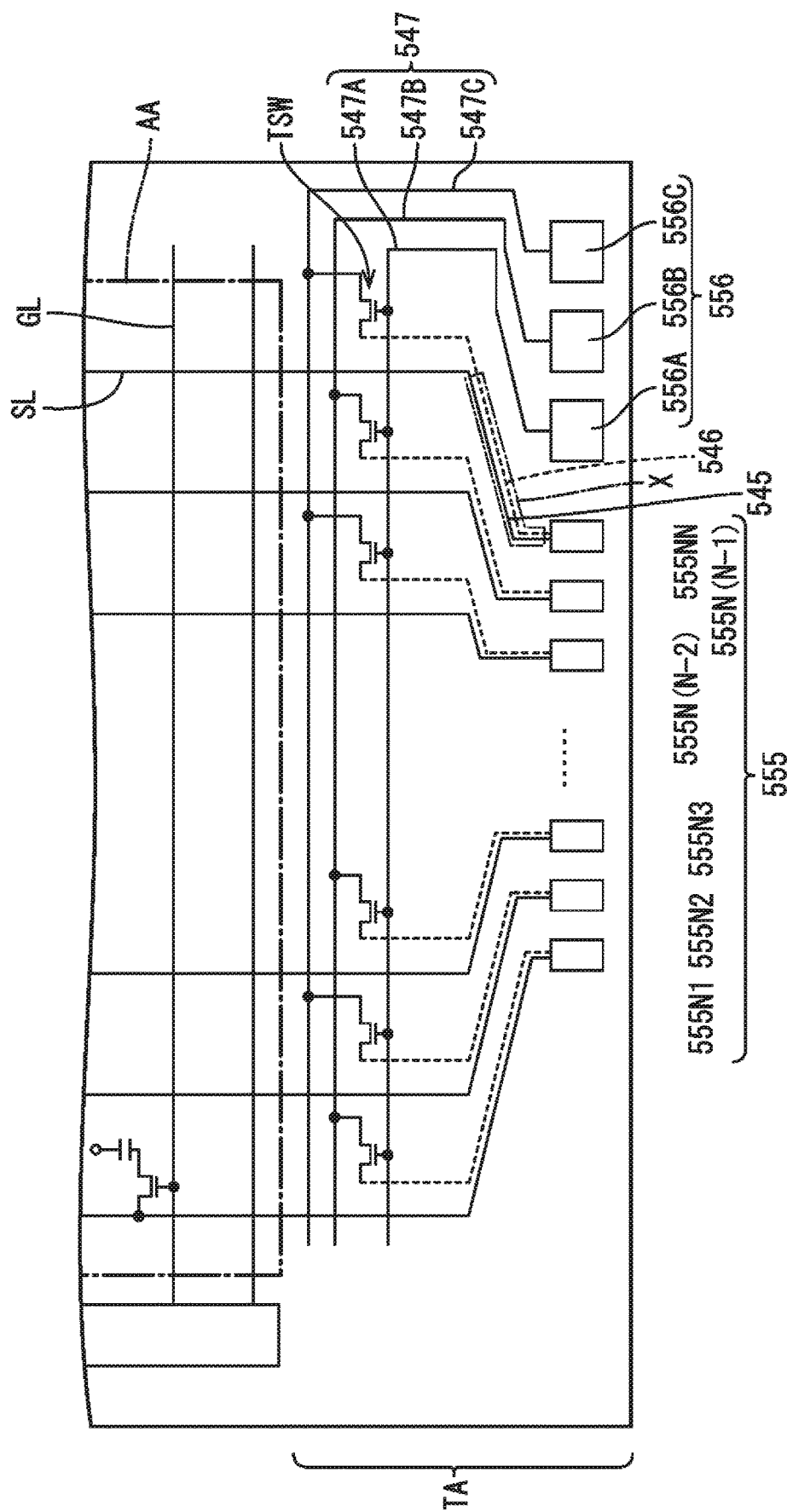
FIG. 13 is a plan view schematically showing a layout of a wiring and the like according to Embodiment 6 disposed in a terminal forming area TA of an array substrate.

FIG. 13 is a plan view showing a terminal forming area TA of the array substrate 510. In FIG. 13, in order to avoid complication of the drawing, the illustration of the terminals (the first terminal 551 and the third terminal 553) for driving the gate driver and the wirings (the first wiring 541 and the third wiring 543) the terminals (the second terminal 552 and the fourth terminal 554) and the wirings (the second wiring 542 and the fourth wiring 544) used for inspecting them is omitted. Instead, three sixth terminals 556 arranged side by side on the right side of a plurality of fifth terminals 555 for performing inspection by energizing the source bus line SL, the seventh wiring 547 for inspection which configures a path for performing inspection by energizing the source bus line SL from the sixth terminals 556, and the inspection switching element TSW formed on the inspection path are shown.

The sixth terminal 556 is an inspection terminal for energizing the source bus line SL arranged in the pixel array area AA when performing lighting inspection of the array substrate 510 before mounting the FPC 9 or the like. In the present embodiment, as an example, although a case where three sixth terminals 556, that is, from the left, a sixth terminal 556A, a sixth terminal 556B, and a sixth terminal 556C are provided will be described, but is not limited to this. In the present embodiment, the sixth terminal 556A has a function of connecting the sixth terminal 556B to the source bus line SL disposed at an odd-numbered position from the left and connecting the sixth terminal 556C to an even-numbered source bus line SL by, for example, turning on the switching element TSW for inspection formed of a TFT (details will be described later). In the following, when distinguishing each sixth terminal, it is represented by adding a suffix of A, B, or C to a code like "sixth terminal 556A", and when collectively referred to without distinction, it is represented by "sixth terminal 556" without a suffix (The same applies to the seventh wiring 547 described later.). Further, there is a case where, out of the N fifth terminals 555 provided so as to correspond to N source bus lines SL arranged in the pixel array area AA, the terminal provided at an odd-numbered position from the left is represented by a fifth terminal 555N (2n−1), and the terminal provided at an even-numbered position from the left is represented by a fifth terminal 555N2n (n represents a natural number). For example, the one provided on the leftmost (first from the left) is represented by a fifth terminal 555N1, the one provided to the right of the fifth terminal 555N1 (second from the left) is represented by a fifth terminal 555N2, and the one provided on the rightmost (Nth from the left) is represented by a fifth terminal 555NN.

The inspection switching element TSW is an inspection element temporarily used in inspection. It is preferable that the sixth terminal 556A is connected to the FPC 9 so that the OFF potential is always applied, because, if the inspection switching element TSW is turned on carelessly when using the product, a normal display will not be possible. For this reason, it is preferable that the sixth terminal 556A is disposed at a position adjacent to the fifth terminal 555 and laid out so as to be connected by one mounting member (one FPC 9).

The sixth wiring 546 is an inspection wiring connecting the fifth terminal 555 and the inspection switching element TSW, and is provided in each of the plurality of fifth terminals 555. The sixth wiring 546 is drawn out from the fifth terminal 555 in the same direction as the fifth wiring 545, and is drawn along the fifth wiring 545 so as to be routed in a fan shape toward the pixel array region AA. As shown in FIG. 13, the sixth wiring 546 is disposed so as to have a parallel section X in which the sixth wiring 546 is disposed close to and parallel to the fifth wiring 545, and then connected to the inspection switching element TSW. The sixth wiring 546 may be formed of a conductive film in the same layer as the fifth wiring 545, or may be formed of a conductive film formed in another layer. Since the fifth wiring 545 is routed relatively densely, particularly in the parallel section X, it is preferable that the fifth wiring 545 and the sixth wiring 546 are formed of conductive films formed in different layers with an insulating film interposed therebetween because both wirings 545 and 546 can be arranged in a narrow area while suppressing short circuit of the both wirings 545 and 546. For example, a configuration is possible in which the fifth wiring 545 is formed of a second metal film over almost the entire section, and the sixth wiring 546 is formed of a first metal film to be connected to the fifth terminal 555 or the inspection switching element TSW in the contact hole provided at an appropriate position.

The seventh wiring 547 is an inspection wiring connecting the sixth terminal 556 to the inspection switching element TSW. In the present embodiment, the drain side of the inspection switching element TSW is connected to the sixth terminal 556A by a seventh wiring 547A drawn out from the sixth terminal 556A among the seventh wirings 547. The seventh wiring 547B is drawn out from the sixth terminal 556B and connected to the source side of the inspection switching element TSW connected to the fifth terminal 555N (2n−1) disposed at an odd-numbered position from the left. The seventh wiring 547C is drawn out from the sixth terminal 556C and connected to the source side of the inspection switching element TSW connected to the source bus line SL disposed at an even-numbered position from the left and the fifth terminal 555N (2n).

A method for energizing the source bus line SL in such a configuration will be described. As described above, when the ON potential is applied to the sixth terminal 556A, the inspection switching element TSW is turned on. In this state, when a predetermined signal is applied to the sixth terminal 556B, the sixth terminal 556B is connected to the source bus line SL disposed at an odd-numbered position from the left via the seventh wiring 547B. That is, regarding the source bus lines SL disposed at an odd-numbered position from the left, a conductive path of "sixth terminal 556B-seventh wiring 547B-inspection switching element TSW-sixth wiring 546-fifth terminal 555N (2n−1)-fifth wiring 545-source bus line SL" is formed. When a predetermined signal is applied to the sixth terminal 556B in this state, the odd-numbered source bus line SL configuring the pixel array area AA can be energized. Further, when a predetermined signal is applied to the sixth terminal 556C in a state where the inspection switching element TSW is turned on, the sixth terminal 556C is connected to the source bus line SL at an even-numbered position from the left via the seventh wiring 547C. That is, regarding the source bus line SL disposed at an even-numbered position from the left, a conductive path of "sixth terminal 556C-seventh wiring 547C-inspection switching element TSW-sixth wiring 546-fifth terminal 555N2n-fifth wiring 545-source bus line SL" is formed. When a predetermined signal is applied to the sixth terminal 556C in this state, an even-numbered source bus line SL configuring the pixel array area AA can be energized.

As described above, the array substrate (wiring substrate) 510 according to the present embodiment includes an insulating base having a plate surface, a pixel (an example of a first circuit) PX related to the display of an image formed in the pixel array area AA on the plate surface, a fifth terminal 555 provided on the plate surface, and to which an FPC (mounting member) 9 is attached, a sixth terminal 556 provided on the plate surface, a source bus line SL connecting the pixel PX and the fifth terminal 555 and the fifth wiring 545, and the sixth wiring 546 which connects the fifth terminal 555 and the sixth terminal 556 together with the seventh wiring 547, is connected to the fifth wiring 545 at the fifth terminal 555, and has a parallel section X in which the sixth wiring 546 is disposed close to and parallel to the fifth wiring 545 without being electrically connected to the fifth wiring 545 outside the fifth terminal 555. According to such a configuration, the inspection can be performed over the entire section of the fifth wiring 545 for driving the pixel PX by energizing the source bus line SL in the array substrate 510. Since the sixth wiring 546 for inspection has a parallel section X in which the sixth wiring 546 is disposed in parallel to the fifth wiring 545, a wiring area required for arranging the wiring can be suppressed. Further, according to such a configuration, even when the fifth terminals 555 for driving the source bus line SL are arranged at a narrow pitch, it is possible to energize the source bus line SL without applying a voltage to the fifth terminal 555 and perform the lighting inspection, thereby eliminating the need of use of a precise and expensive probe or the like. As described above, the configuration of the present disclosure is applied to the driving of the source bus line SL to obtain the effect.

Other Embodiments

The present disclosure is not limited to embodiments described with reference to the descriptions and the drawings, and the following embodiments are also included, for example, within the technical scope of the present disclosure.

Figure 14A:
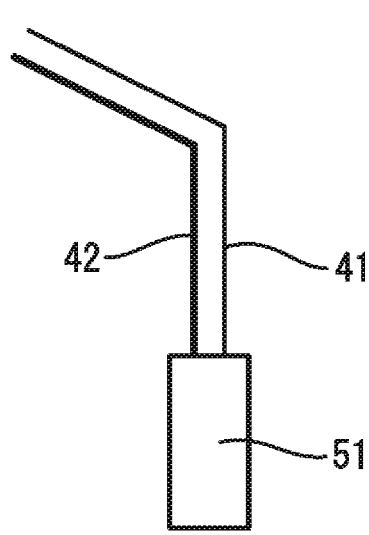
FIG. 14A is an enlarged plan view of a portion where a wiring is drawn out from a terminal according to Embodiment 1.
Figure 14B:
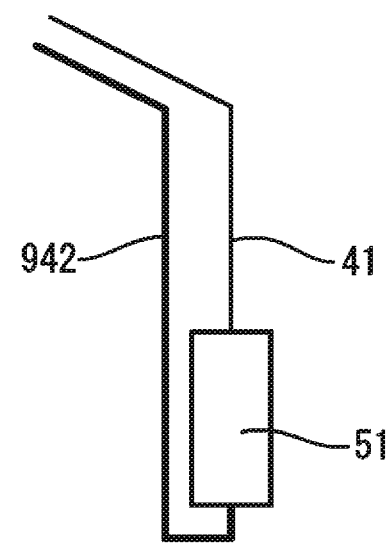
FIG. 14B is an enlarged plan view of a portion where a wiring is drawn out from a terminal according to a modification example.
Figure 14C:
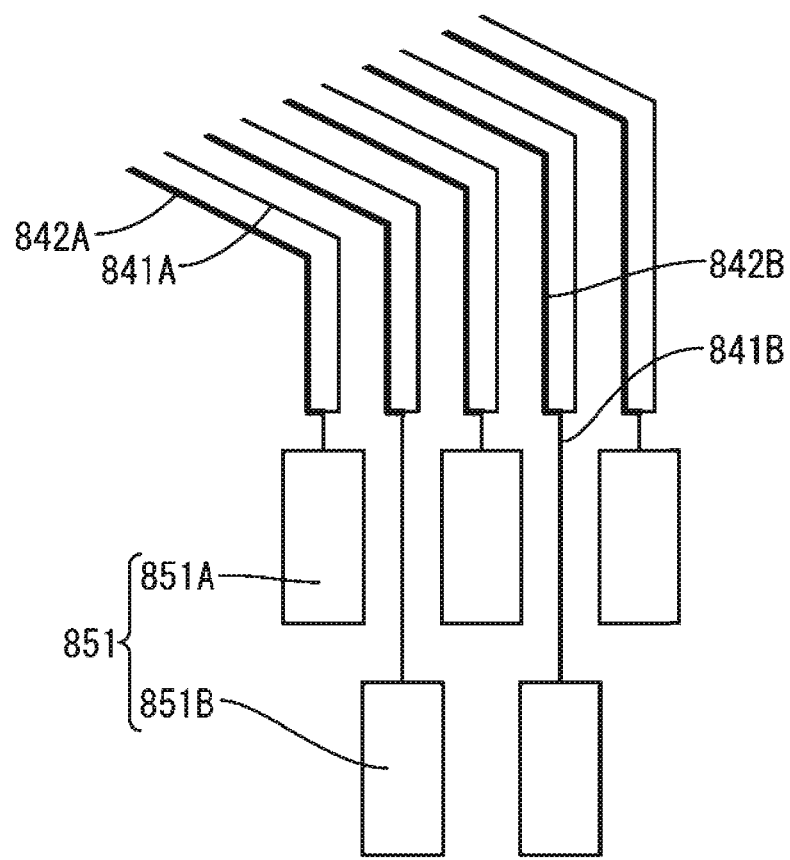
FIG. 14C is an enlarged plan view of a portion where a wiring is drawn out from a terminal according to another modification example.

(1) In the present disclosure, a second wiring may have a parallel section X in which the second wiring is disposed close to and parallel to a first wiring without being electrically connected to the first wiring outside the first terminal, and its arrangement path is not particularly limited. FIG. 14A is a plan view showing a basic configuration of a lead-out portion of the first wiring 41 for driving and the second wiring 42 for inspection, from the first terminal 51 for driving described in the configuration of the above-described Embodiment 1. The first wiring 41 and the second wiring 42 are simply drawn out in parallel in a direction from the first terminal 51 to the first circuit 31. In the above-described Embodiment 2 to Embodiment 6, the lead-out portion of the drive wiring and the inspection wiring from the drive terminal has been described as having approximately the same planar configuration, but may have a different planar configuration. For example, in the modification example shown in FIG. 14B, the second wiring 942 for inspection is drawn out from the first terminal 51 in a direction different from the drawing direction (upward) of the first wiring 41, for example, in a direction (downward) different by 180 degrees. After the second wiring 942 is bent so as to wind around the first terminal 51, the second wiring 942 is disposed so as to have a parallel section X such that the second wiring 942 extends along the first wiring 41 only in a predetermined section, that is, such that the second wiring 942 is disposed close to and parallel to the first wiring 41. According to such a configuration, not only disconnection of the first wiring 41 but also loss of the first terminal 51 itself can be detected. In a case where a fixed wiring space can be secured around the first terminal 51, this planar configuration may be adopted. Further, in the modification example shown in FIG. 14C, the first terminal 851 is configured of a plurality of first terminals 851A on the side close to the circuit and a plurality of first terminals 851B on the side far from the circuit. The first terminal 851A and the first terminal 851B are respectively arranged at a small pitch and arranged with a two-stage staggered shape as a whole. Since the second wiring 842A for inspection drawn out from the first terminal 851A is branched from the first wiring 841A for driving, and a section $L_A$ from the branch point between the first wiring 841A and the second wiring 842A to the first terminal 851A is only the first wiring 841A for driving, in the inspection using the second wiring 842A as the inspection wiring, disconnection or the like of the first wiring 841A generated in the section $L_A$ cannot be detected. However, in this modification example, the branch point between the first wiring 841A and the second wiring 842A is provided very close to the first terminal 851A, and the second wiring 842A can be substantially connected to the first terminal 851A. As described above, the section $L_A$ from the branch point between the first wiring 841A and the second wiring 842A to the first terminal 851A is very short, and the proportion occupied by the section $L_A$ with respect to the total length of the first wiring 841A is, for example, small enough to be acceptable to those skilled in the art, several percent or less, when the occurrence rate of disconnection or the like in the section $L_A$ can be extremely reduced, the effect of the present disclosure can be enjoyed. On the other hand, a first wiring 841B for driving drawn out from the first terminal 851B is disposed so as to face the circuit through a narrow area between two adjacent first terminals 851A, and a second wiring 842B for inspection is branched from a branch point provided on the circuit side of the first terminal 851A. Since a section $L_B$ from the branch point between the first wiring 841B and the second wiring 842B to the first terminal 851B is only the first wiring 841B for driving, in the inspection using the second wiring 842B as the inspection wiring, disconnection or the like of the first wiring 841B generated in the section $L_B$ cannot be detected. However, when it is considered that the lengths of the section $L_A$ and the first terminal 851A in the wiring direction and the like are extremely short, the proportion occupied by the section $L_B$ with respect to the total length of the first wiring 841B is small enough to be acceptable to those skilled in the art, for example, several percent or less, and the first wiring 841B and the second wiring 842B are substantially connected to the first terminal 851B, the occurrence rate of disconnection or the like in the section $L_B$ can be extremely low. Thus, the effect of the present disclosure can be enjoyed even for the first terminal 851B having such a connection configuration.

(2) In the above embodiment, the wiring configuration for inspecting the drive wiring or a drive terminal, for driving the gate driver formed monolithically on the wiring substrate, or for driving the pixels by directly energizing the source bus line from an external circuit has been described, but is not limited to such a configuration. For example, the wiring configuration described in Embodiment 5 may be applied to a wiring substrate in which a gate bus line is directly energized from an external circuit, rather than energizing the gate bus line via the monolithically formed gate driver in order to inspect wirings and terminals related thereto.

(3) In the above embodiment, a rectangular plate-like wiring substrate or a display panel provided with a rectangular pixel array area has been described, but is not limited to this. For example, it can be applied to a variant display panel provided with a pixel array area having an elliptical shape or an indefinite shape. Although such a variant display panel may not secure a terminal forming area of sufficient size, according to the present disclosure, for example, an area required for arranging wirings for inspection can be suppressed, and various terminals and wirings can be efficiently provided in a terminal forming area, which is preferable.

(4) In the above embodiment, the liquid crystal panel and the wiring substrate provided in the liquid crystal panel have been described, but are not limited to this. The present disclosure can be also applied to a display panel such as an organic EL panel or MEMS other than a liquid crystal panel, and a wiring substrate provided therein. Further, the size of the display panel and the wiring substrate is not particularly limited and can be widely applied from a small display panel for portable device to a large display panel for television or outdoor display.

While there have been described what are at present considered to be certain embodiments of the invention, it will be understood that various modifications may be made thereto, and it is intended that the appended claim cover all such modifications as fall within the true spirit and scope of the invention.

What is claimed is:
1. A wiring substrate comprising:
an insulating base that has a plate surface;
a first circuit that is provided on the plate surface;
a first terminal that is provided on the plate surface, and to which a mounting member is attached;
a second terminal that is provided on the plate surface;
a first wiring that electrically connects the first circuit with the first terminal; and
a second wiring that electrically connects the second terminal and the first terminal and the first wiring, the second wiring having a parallel section in which a portion of the second wiring outside the first terminal is disposed adjacent to and parallel to the first wiring;

wherein, in the parallel section, the first wiring and the second wiring are formed of conductive films formed in different layers on the plate surface via an insulating film; and wherein, in the parallel section, the first wiring and the second wiring are at least partially overlapped with each other when viewed from a normal direction of the plate surface.

2. The wiring substrate comprising according to claim 1, wherein the second wiring directly connects the second terminal and the first terminal.

3. The wiring substrate comprising according to claim 1, wherein a line width of the second wiring is wider than a line width of the first wiring.

4. The wiring substrate comprising according to claim 1, wherein a line width of the second wiring is wider than a line width of the first wiring.

5. The wiring substrate comprising according to claim 1, wherein the first wiring and the second wiring includes a multilayer film, and at least one layer of the multilayer film includes aluminum.

6. The wiring substrate comprising according to claim 1, further comprising:
a second circuit that is provided on the plate surface;
a third terminal that is provided on the plate surface, and to which the mounting member is attached, and
a third wiring that connects the second circuit and the third terminal to each other,
wherein a part of the third wiring extends along the first wiring.

7. The wiring substrate according to claim 6, further comprising:
a fourth wiring that is branched from a middle of the third wiring, and connects the second circuit and the fourth terminal together with a portion of the third wiring.

8. A display panel comprising the wiring substrate according to claim 1.

9. A wiring substrate comprising:
an insulating base that has a plate surface;
a first circuit that is provided on the plate surface;
a first terminal that is provided on the plate surface, and to which a mounting member is attached;
a second terminal that is provided on the plate surface;
a first wiring that electrically connects the first circuit with the first terminal; and
a second wiring that electrically connects the second terminal and the first terminal and the first wiring;
wherein, the second wiring includes one end electrically connected to the second terminal and the other end electrically connected to the first terminal, the other end is located closer to the first terminal than the first circuit,
wherein, a part of the second wiring extends along the first wiring, and
wherein the first wiring and the second wiring are at least partially overlapped with each other when viewed from a normal direction of the plate surface.

10. The wiring substrate comprising according to claim 9, wherein the second wiring directly connects the second terminal and the first terminal.

11. The wiring substrate comprising according to claim 9, wherein a line width of the second wiring is wider than a line width of the first wiring.

12. The wiring substrate comprising according to claim 9, wherein a line width of the second wiring is wider than a line width of the first wiring.

13. The wiring substrate comprising according to claim 9, wherein the first wiring and the second wiring includes a multilayer film, and at least one layer of the multilayer film includes aluminum.

14. The wiring substrate comprising according to claim 9, further comprising:
a second circuit that is provided on the plate surface;
a third terminal that is provided on the plate surface, and to which the mounting member is attached, and
a third wiring that connects the second circuit and the third terminal to each other,
wherein a part of the third wiring extends along the first wiring.

15. The wiring substrate according to claim 14, further comprising:
a fourth wiring that is branched from a middle of the third wiring, and connects the second circuit and the fourth terminal together with a portion of the third wiring.

16. A display panel comprising the wiring substrate according to claim 9.

17. A wiring substrate comprising:
an insulating base that has a plate surface;
a first circuit that is provided on the plate surface;
a first terminal that is provided on the plate surface, and to which a mounting member is attached;
a second terminal that is provided on the plate surface;
a first wiring that electrically connects the first circuit with the first terminal; and
a second wiring that electrically connects the second terminal and the first terminal and the first wiring;
wherein, the second wiring extends from the second terminal toward the first terminal and has a portion along the first wiring, and
wherein the first wiring and the second wiring are at least partially overlapped with each other when viewed from a normal direction of the plate surface.

18. The wiring substrate comprising according to claim 17, wherein the second wiring directly connects the second terminal and the first terminal.

19. The wiring substrate comprising according to claim 17, wherein a line width of the second wiring is wider than a line width of the first wiring.

20. The wiring substrate comprising according to claim 17, wherein a line width of the second wiring is wider than a line width of the first wiring.

21. The wiring substrate comprising according to claim 17, wherein the first wiring and the second wiring includes a multilayer film, and at least one layer of the multilayer film includes aluminum.

22. The wiring substrate comprising according to claim 17, further comprising:
a second circuit that is provided on the plate surface;
a third terminal that is provided on the plate surface, and to which the mounting member is attached, and
a third wiring that connects the second circuit and the third terminal to each other,
wherein a part of the third wiring extends along the first wiring.

23. The wiring substrate according to claim 22, further comprising:
a fourth wiring that is branched from a middle of the third wiring, and connects the second circuit and the fourth terminal together with a portion of the third wiring.

24. A display panel comprising the wiring substrate according to claim 17.

\* \* \* \* \*